United States Patent [19]

Bozler et al.

[11] Patent Number: 5,032,538
[45] Date of Patent: Jul. 16, 1991

[54] SEMICONDUCTOR EMBEDDED LAYER TECHNOLOGY UTILIZING SELECTIVE EPITAXIAL GROWTH METHODS

[75] Inventors: Carl O. Bozler, Sudbury, Mass.; Gary D. Alley, Londonderry, N.H.; William T. Lindley, Lexington; R. Allen Murphy, Hudson, both of Mass.

[73] Assignee: Massachusetts Institute of Technology, Cambridge, Mass.

[21] Appl. No.: 73,912

[22] Filed: Jul. 7, 1987

Related U.S. Application Data

[63] Continuation of Ser. No. 431,055, Sep. 30, 1982, abandoned, which is a continuation-in-part of Ser. No. 65,514, Aug. 10, 1979, Pat. No. 4,378,629.

[51] Int. Cl.[5] .................... H01L 21/20; H01L 21/74; H01L 21/95
[52] U.S. Cl. ........................ 437/83; 148/DIG. 164; 148/DIG. 26; 148/DIG. 53; 148/DIG. 115; 148/DIG. 142; 156/612; 357/15; 357/22; 357/55; 357/68
[58] Field of Search ............... 148/DIG. 164; 357/15, 357/22, 41, 55, 68; 437/83, 89, 175, 911, 80

[56] References Cited

U.S. PATENT DOCUMENTS 2,524,033 10/1950 Bardeen .
2,569,347 9/1951 Shockley .
2,820,154 1/1958 Kurshan .
3,121,809 2/1964 Atalla .
3,250,966 5/1966 Rose .
3,250,967 5/1966 Rose .
3,274,461 9/1966 Teszner .
3,322,581 5/1967 Hendrickson et al. .
3,372,069 3/1968 Bailey et al. .
3,375,418 3/1968 Garnache et al. .

(List continued on next page.)

FOREIGN PATENT DOCUMENTS 48-24682 3/1973 Japan .
50-74384 6/1975 Japan .
53-90774 8/1978 Japan .
54-82178 6/1979 Japan .
948239 1/1964 United Kingdom .
1144147 3/1969 United Kingdom .

OTHER PUBLICATIONS

Roth et al., "Silicon Epitaxy by Solid-Phase Recrystallization..." Appl. Phys. Lett., vol. 31, No. 10, Nov. 15, 1977, pp. 689-691.

(List continued on next page.)

Primary Examiner—William G. Saba
Attorney, Agent, or Firm—Hamilton, Brook, Smith & Reynolds

[57] ABSTRACT

A permeable base transistor (30) including a metal base layer (34) embedded in a semiconductor crystal (32) to separate collector (38) and emitter (40) regions and form a Schottky barrier with each is disclosed. The metal base layer has at least one opening (37) through which the crystal semiconductor (32) joins the collector (38) and emitter (40) regions. Ohmic contacts (42,44) are made to the emitter (38) and collector (40) regions. The width of all openings (37) in the base layer (34) is of the order of the zero bias depletion width corresponding to the carrier concentration in the opening. The thickness of the metal layer (34) is in the order of 10% of this zero bias depletion width. As a result, a potential barrier in each opening limits current flow over the lower portion of the bias range. With increasing forward base bias the potential in the openings, which is lower than along the metal of the base layer (34), is lowered sufficiently to permit substantial increase in the barrier limited current flow from the collector (38) to emitter (40).

A method of fabricating this transistor as well as methods for forming integrated circuit structures are also disclosed. Metal and other layers may be selectively embedded in semiconductor crystal. Embedded metal layers may serve as interconnections between devices. Devices may be in a stacked configuration.

31 Claims, 25 Drawing Sheets

U.S. PATENT DOCUMENTS

| | | |
|---|---|---|
| 3,381,189 | 4/1968 | Hinkle, Jr. et al. . |
| 3,386,864 | 6/1968 | Silvestri et al. . |
| 3,394,289 | 7/1968 | Lindmayer . |
| 3,401,449 | 9/1968 | Shaw . |
| 3,425,879 | 2/1969 | Shaw et al. . |
| 3,497,777 | 2/1970 | Teszner . |
| 3,501,342 | 3/1970 | Haberecht et al. . |
| 3,571,675 | 3/1971 | Faust . |
| 3,582,410 | 6/1971 | Chapelle . |
| 3,597,270 | 8/1971 | Scott-Monck et al. . |
| 3,614,560 | 10/1971 | Anantha . |
| 3,676,732 | 7/1972 | Gabor . |
| 3,703,408 | 11/1972 | Belosco et al. ........... 148/DIG. 142 |
| 3,751,723 | 8/1973 | Shirn et al. . |
| 3,774,170 | 11/1973 | Koch . |
| 4,059,461 | 11/1977 | Fan et al. .............................. 148/1.5 |
| 4,127,861 | 11/1978 | Deneuville . |
| 4,170,019 | 10/1979 | Hysell et al. . |

OTHER PUBLICATIONS

A. B. Fowler, "Metal subcollector bipolar transistor," *IBM Technical Disclosure Bulletin*, vol. 20, No. 4, 9/77, p. 1668.

O. S. Spencer, "Fabrication of sublayer of interconnect lines for high density MOS LSI chips," *IBM Technical Disclosure Bulletin*, vol. 20, No. 11A, 4/78, p. 4461.

C. O. Bozler, "Permeable base transistor," *Proceedings of the Seventh Biennial Cornell Electrical Engineering Conference*, Aug. 14–16, 1979, Ithaca, N.Y., pp. 33–42.

Anantha, N. G., "Fabricating a Metal Base Transistor", *IBM Technical Disclosure Bulletin*, vol. 13, No. 8, Jan. 1970, pp. 2149–2150.

Nishizawa, J., T. Terasaki and J. Shibata, "Field-Effect Transistor Versus Analog Transistor (Static Induction Transistor)", *IEEE Transaction of Electron Devices*, vol. ED-22, No. 4, Apr. 1975, pp. 185–197.

Nishizawa, J., "Device Applications: The Statis Induction Transistor and Integrated Circuits", *Crystal Growth Theory Techniques*, 1978, pp. 98–107.

Mochida, Y., J. Nishizawa, T. Ohmi and R. Gupta, "Characteristics of Static Induction Transistors: Effects of Series Resistance", *IEEE Transactions of Electron Devices*, vol. ED-25, No. 7, Jul. 1978, pp. 761–767.

Zuleeg, R., "Multi-Channel Field-Effect Transistor Theory and Experiment", *Solid State Electronics*, vol. 10, pp. 559–576.

Ozawa, O., "Temperature Dependence of Triodelike JFET Drain Current After Pinchoff", *IEEE Transactions on Electron Devices*, Jun. 1977, pp. 768–769.

Teszner, S. and R. Gicquel, "Gridistor—A New Field Effect Device", *Proceedings of the IEEE*, Dec. 1964, pp. 1502–1513.

Esaki, L. and L. L. Chang, "Ultimate FET Structures", *Proceedings of the IEEE*, Dec. 1965, pp. 2117–2118.

Sprague, J. L., J. Lindmayer, R. Garnache and J. J. Casey, "Metal-Base Transistor Studies", 23rd Conference on Physical Electronics Applied MIT, Cambridge, Mass. 1963.

Lindmayer, Joseph, "The Metal-Gate Transistor", *Proceedings of the IEEE* 1964, p. 1751.

Lindmayer, J. and Wigley, "Metal Gate Transistor", *Fundamentals of Semiconductor Devices*, pp. 458–460.

Von Muench, W., "Producing Semiconductor Devices by Oriented Lateral Overgrowth", IBM Technical Disclosure Bulletin, vol. 10, No. 10, Mar. 1968, pp. 1469–1470.

Nishizawa, J. and M. Watanabe, "A Semiconductor Device with High Re-Resistance Area", *Patent Report of Bureau of Patents*, Nov. 25, 1953.

Rose, A., "An Analysis of Gain-Bandwidth Limitations of Solid-State Triodes", *RCA Rev.*, vol. 24, Dec. 1963, pp. 627–640.

Shockley, W., "The Path of the Conception of the Junction Transistor", *IEEE Transactions on Electron Devices*, vol. ED-23, No. 7, Jul. 1976, pp. 597–620.

Tausch, F. W. and A. G. Lapierre, III, "A Novel Crystal Growth Phenomenon: Single Crystal GaAs Overgrowth onto Silicon Dioxide", *Journal of the Electrochemical Society*, vol. 112, No. 7, Jul. 1965, pp. 706–709.

Yamaguchi, K. and H. Kodera, "Optimum Design of Triode-Like JFETR's by Two-Dimensional Computer Simulation", *IEEE Transactions on Electron Devices*, vol. ED-24, No. 8, Aug. 1977, pp. 1061–1069.

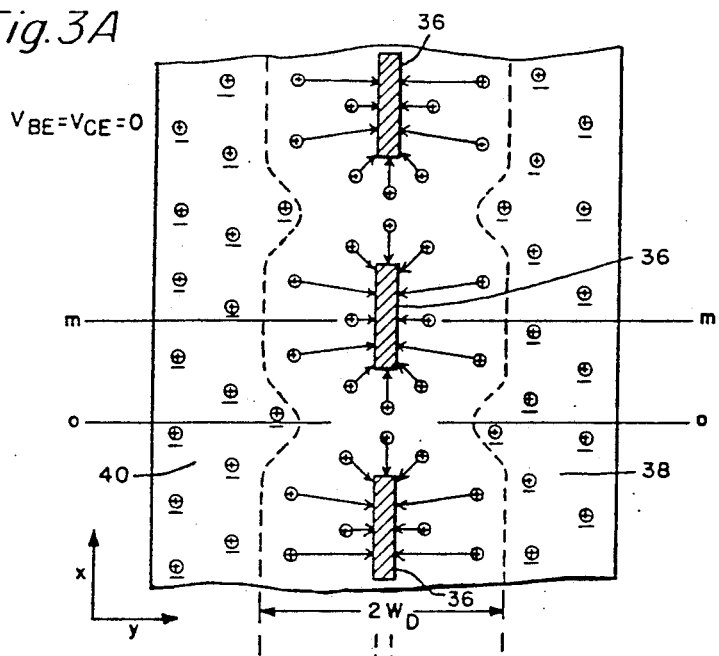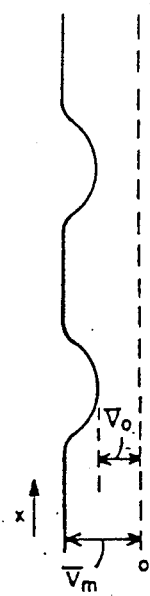
*Fig.3A*
*Fig.3G*
*Fig.3B* CHARGE DENSITY ON LINE m-m
*Fig.3C* CHARGE DENSITY ON LINE o-o
*Fig.3D* ELECTRIC FIELD ON LINE m-m
*Fig.3E* ELECTRIC FIELD ON LINE o-o
*Fig.3F* POTENTIAL BARRIER ON LINES o-o & m-m

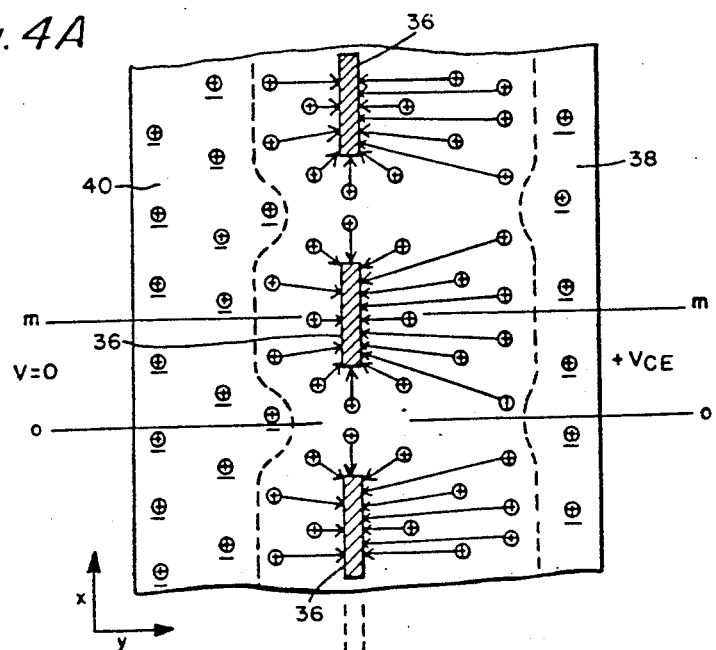
*Fig. 4A*
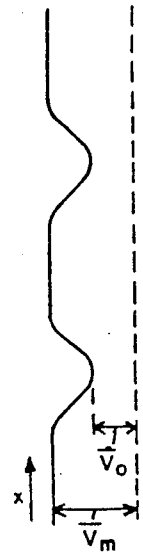
*Fig. 4C*
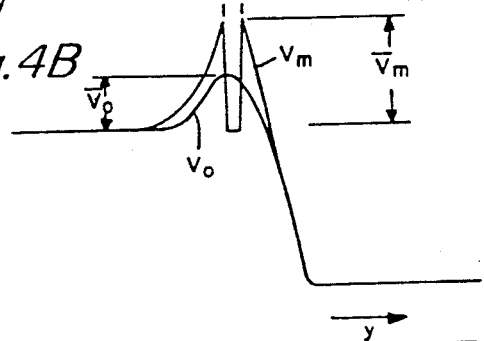
*Fig. 4B*
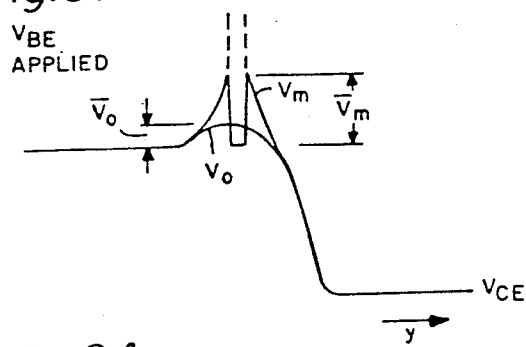
*Fig. 5A* $V_{BE}$ APPLIED
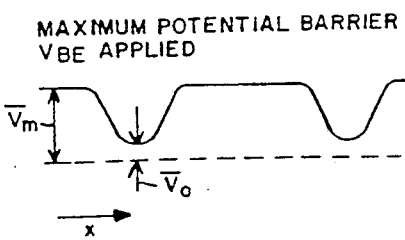
*Fig. 5B* MAXIMUM POTENTIAL BARRIER $V_{BE}$ APPLIED
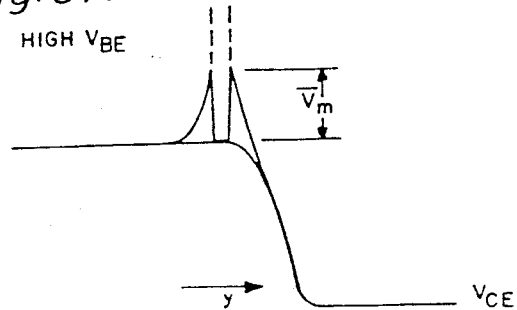
*Fig. 6A* HIGH $V_{BE}$
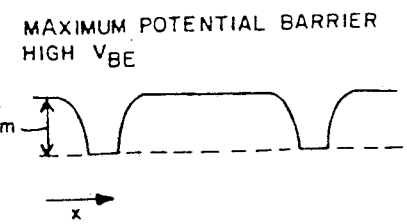
*Fig. 6B* MAXIMUM POTENTIAL BARRIER HIGH $V_{BE}$

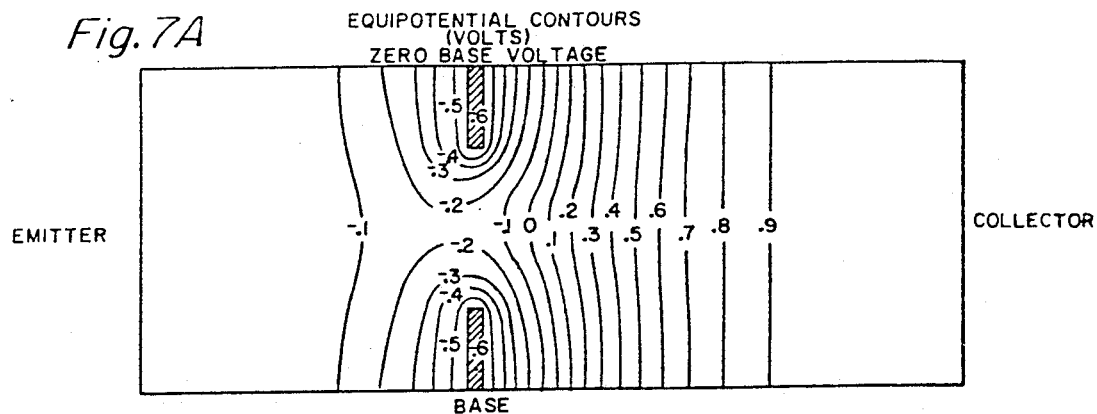
Fig. 7A EQUIPOTENTIAL CONTOURS (VOLTS) ZERO BASE VOLTAGE
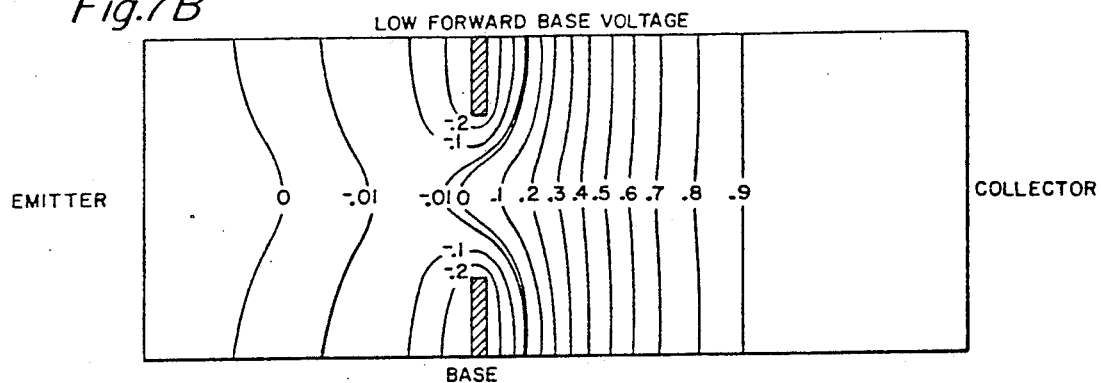
Fig. 7B LOW FORWARD BASE VOLTAGE
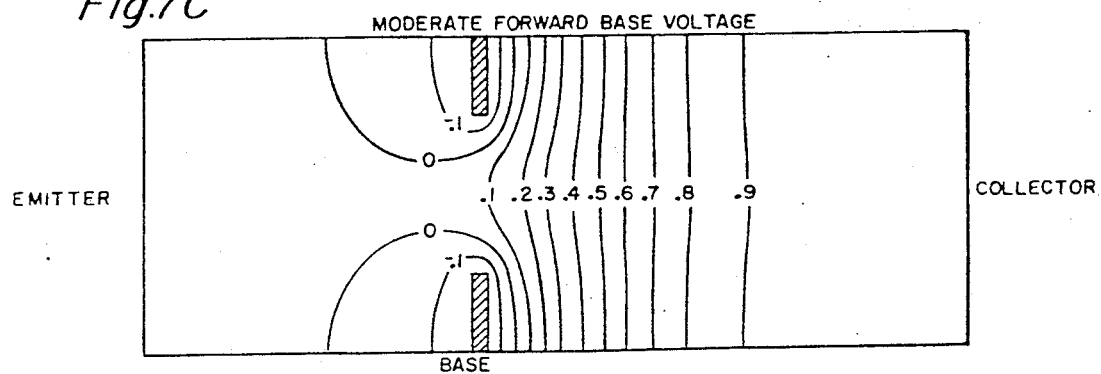
Fig. 7C MODERATE FORWARD BASE VOLTAGE
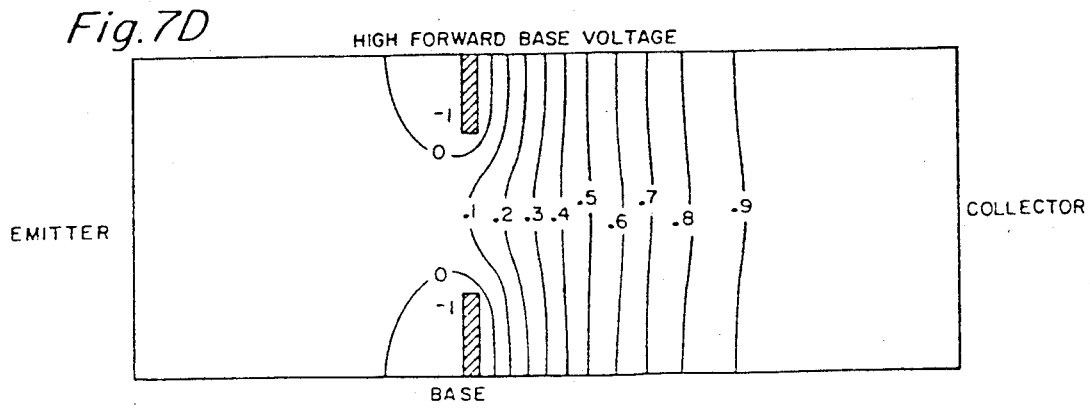
Fig. 7D HIGH FORWARD BASE VOLTAGE

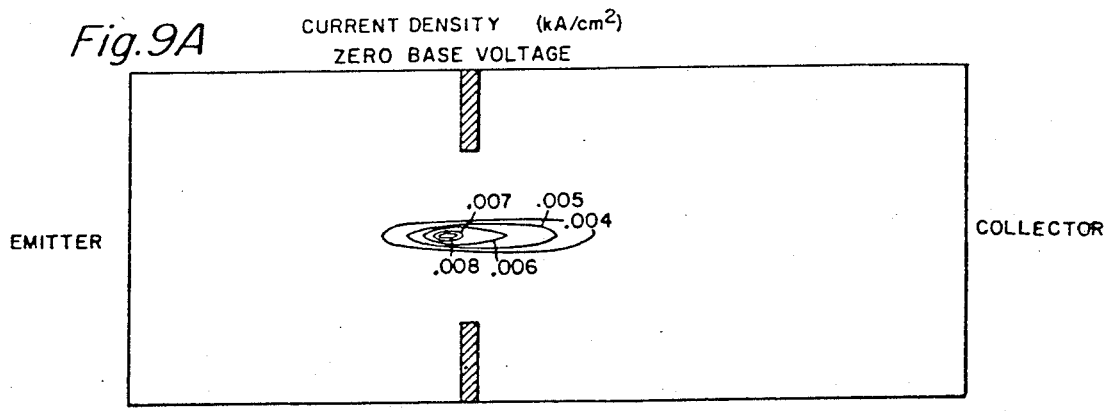
Fig.9A CURRENT DENSITY (kA/cm²) ZERO BASE VOLTAGE
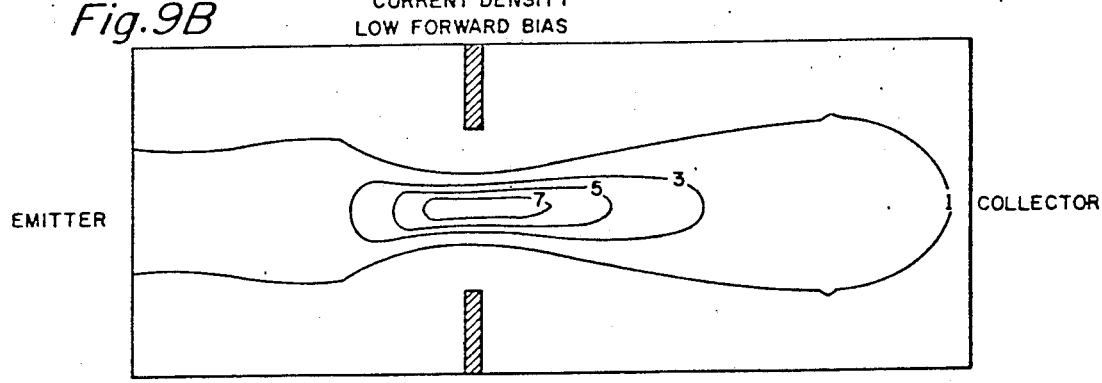
Fig.9B CURRENT DENSITY LOW FORWARD BIAS
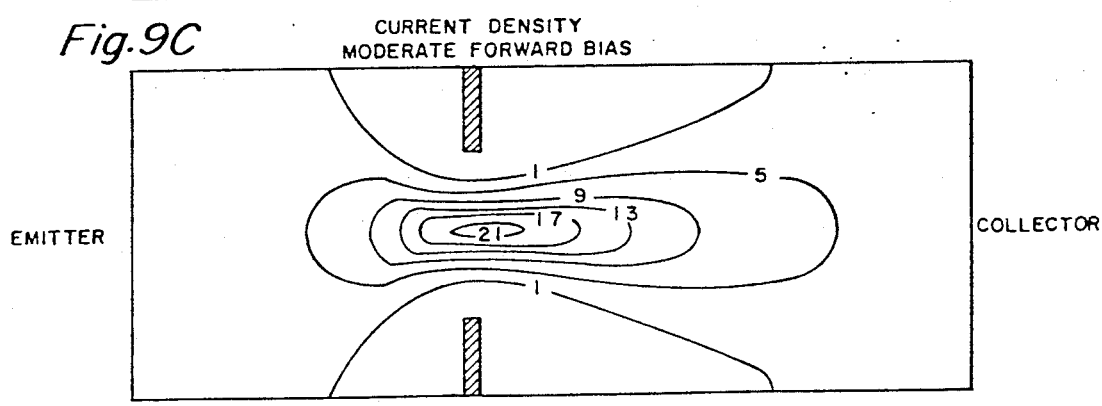
Fig.9C CURRENT DENSITY MODERATE FORWARD BIAS
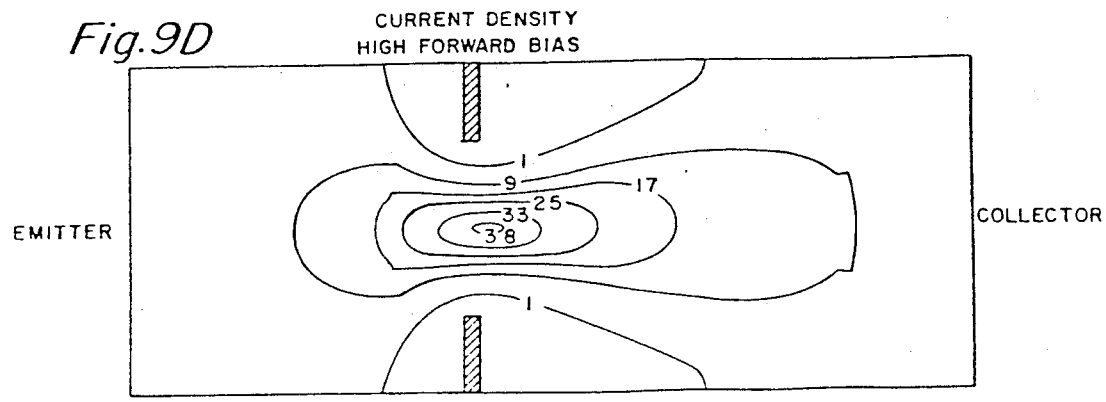
Fig.9D CURRENT DENSITY HIGH FORWARD BIAS

PERMEABLE BASE TRANSISTOR
COLLECTOR CHARACTERISTICS

PBT COMMON BASE CURRENT GAIN

MAXIMUM STABLE GAIN AND MAXIMUM AVAILABLE GAIN vs FREQUENCY

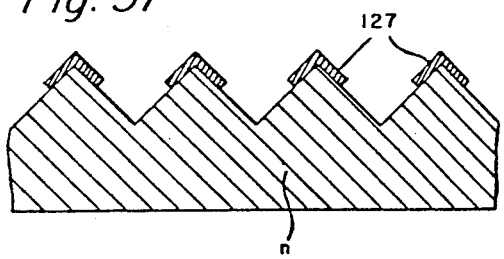
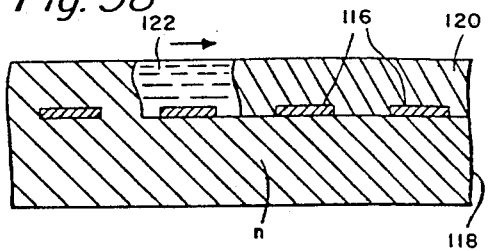
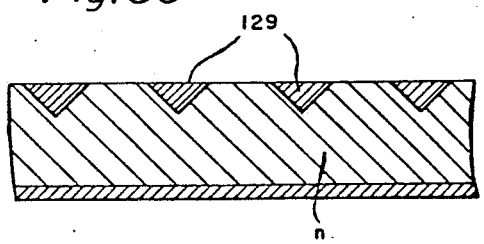
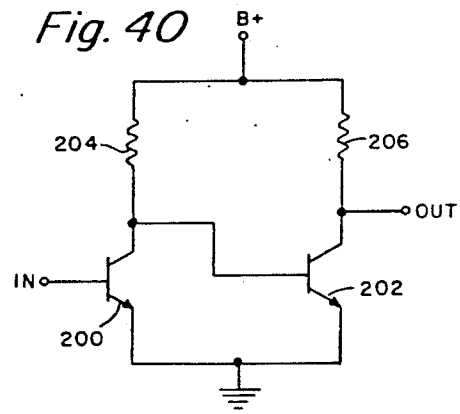
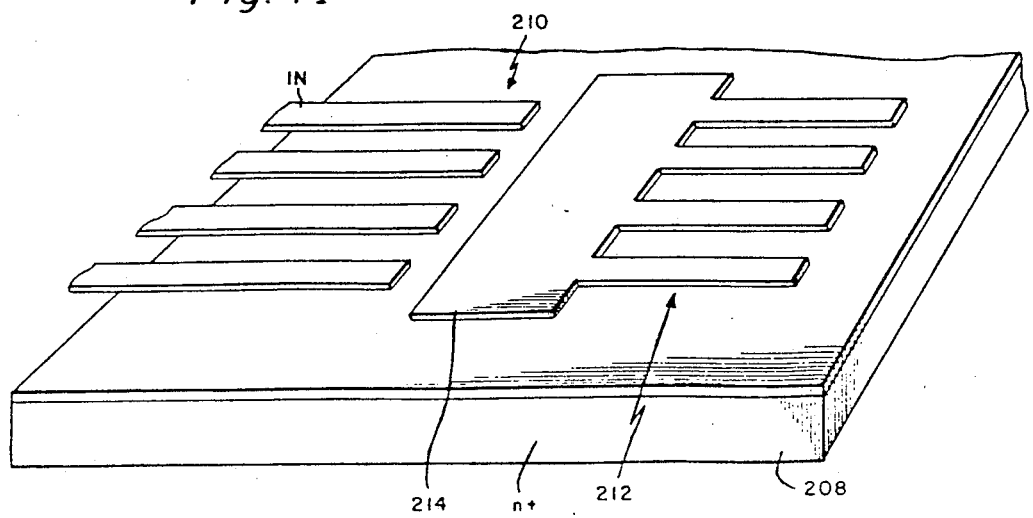

SEMICONDUCTOR EMBEDDED LAYER TECHNOLOGY UTILIZING SELECTIVE EPITAXIAL GROWTH METHODS

The Government has rights in this invention pursuant to Contract Number AF19(628)-78-C-0002 awarded by the U.S. Department of the Air Force.

RELATED APPLICATIONS

This is a continuation of co-pending application Ser. No. 431,055 filed on Sept. 30, 1982, now abandoned, which is a continuation-in-part of U.S. Pat. application Ser. No. 065,514, filed Aug. 10, 1979, now U.S. Pat. No. 4,378,629.

RELATED PUBLICATIONS

Certain aspects of this invention are described in the following publications by two of the coinventors:

Bozler, Carl O., Gary D. Alley, "Fabrication and Numerical Simulation of the Permeable Base Transistor," *IEEE Transactions on Electron Devices*, Vol. ED-27, No. 6, June 1980; and Bozler, Carl O. and Gary D. Alley, "The Permeable Base Transistor and Its Application to Logic Circuits," *Proceedings of the IEEE*, Vol. 70, No. 1, January 1982.

TECHNICAL FIELD

This invention relates to semiconductor devices and circuits and their manufacture. In particular, the invention relates to a transistor having high current and voltage gain at frequencies into the submillimeter region of the electromagnetic spectrum and to a high packing density integrated circuit.

BACKGROUND ART

An integrated circuit can contain thousands of transistor devices on a single minute chip of semiconductor crystal because of the advanced miniaturization used in current semiconductor technology. But the limits imposed by conventional transistor structures and circuit geometry are quickly being approached. An object of this invention is to provide a transistor device having operating characteristics more favorable than those of any previously known devices which is particularly suitable for use in very high packing density integrated circuits. A further object of this invention is to provide a fabrication technique which allows for high density packing of transistor devices and their interconnections in integrated circuits.

A conventional bipolar transistor consists of a three layer pnp or npn semiconductor sandwich. These semiconductor layers form the emitter, base and collector of the device. In its operation, voltage bias is applied across the pn junctions at the interfaces of those layers through ohmic contacts made to each layer. Bipolar transistors are generally designed so that, when the emitter-base junction is forward biased, the current in the base is carried mostly by minority carriers (electrons or holes) which are injected from the emitter. Almost all of the injected current carriers pass through the base layer and are swept into the collector, forming the collector current ($I_c$). The injected current at low current density is an exponential function of the bias voltage ($V_{BE}$) applied to the emitter base junction so that the transconductance $g_m = (\partial I_c / \partial V_{BE})/V_{CE} = $ constant increases exponentially with voltage and becomes very large. Even at high injection levels the transconductance can increase with increasing injection but the increase is not as rapid as at low injection levels. A major advantage of the bipolar transistor is the very high transconductance that can be achieved for a given emitter-base junction area. A major limitation of the bipolar transistor is the time delay associated with the minority carrier transport in the base layer, which is responsible for charge storage delay. This delay presently limits the maximum frequency of oscillation of practical bipolar devices to approximately 20 GHz.

The metal base transistor is believed to have great potential because of its predicted high frequency performance. It is similar to the npn transistor except that the p layer is replaced by a metal to eliminate minority carrier charge storage in the base. The disadvantage of this device has been that the injected electrons experience considerable scattering as they pass through the metal layer. The result is a low ratio of collector current to emitter current $\alpha$, even though the transconductance $g_m$ can still be relatively high. The low $\alpha$ indicates low current gain and is a disadvantage in many applications, such as for example use in a digital computer circuit.

A metal gate transistor having high current gain was described by Joseph Lindmayer in the Proceeding of the IEEE, 1964, page 1751. In order to explain the high current gain of the device, the author postulated that the metal gate had random "weak points" through which the semiconductor layers are attached. However, the transconductance of the device $g_m$ was low. Presumably, the ratio $g_m/C_{be}$ was also very low and the device was thus not appropriate for high frequency applications. A cutoff frequency of 10 MHz was reported.

In field effect transistors (FET) there is no minority carrier injection under normal operation. The device consists of a conducting channel made of semiconductor material with ohmic contacts at both ends. The channel passes near one or more electrodes or between two electrodes in such a way that voltage applied to the electrodes causes a modulation of the resistance of the channel. In an FET, as electrons or holes pass through the channel they do not pass over a barrier; rather, their potential always decreases as they move from source to drain. There are several types of FETs depending on the gate structure. The gate can be a pn junction (JFET), a Schottky barrier diode (MESFET) or a metal oxide semiconductor diode (MOSFET). Also, other configurations with gates buried in semiconductor material have been discussed in the literature, such as the gridistor and the analog transistor.

There are a number of modes for biasing FET devices. In all cases the transconductance is a function of the current in the channel, but is never as large, per unit of current, as is possible in a bipolar transistor. It is generally believed from calculation and experiments noted in the literature that the highest FET transconductance is achieved with a gate length which is several times larger than the channel thickness. Because there is no minority carrier injection with reverse gate bias, the maximum frequency of oscillation extends to 100 GHz and is limited by factors other than minority carrier injection.

The static induction transistor (SIT) is another three terminal device which can be used at microwave frequencies. The definition of this device is, at this writing, somewhat imprecise and in fact substantial overlap currently exists between what is labelled as SIT operation by some and FET operation by others. The SIT in its most common form includes a grid of p-type semiconductor material interposed between n-type source and drain regions. Voltage applied to the grid (or gate) controls the current flowing from the drain to the source. When the gate is negatively biased with respect to the source the control mechanism is the modulation of a potential barrier. When the gate is forward biased with respect to the source the control mechanism becomes a complicated combination of potential barrier modulation, conductance modulation and charge accumulation effects. These effects vary with device geometry and are largely responsible for the current semantic confusion connected with this device. Other versions of the SIT incorporate Schottky-barrier gate contacts fabricated on the same surface of the semiconductor as the source contact or fabricated in channels along side the source contact.

Although high frequency performance has been predicted for SIT devices, each version suffers from some disadvantage. In SIT's with p-type gate structures solid-state diffusion and series resistance limit the minimum dimensions achievable, which in turn limits the frequency of use to the low end of the microwave spectrum. Moreover, forward bias operation produces minority carrier injection and all of the associated deleterious time delay and diffusion capacitance effects. Other configurations in which gate structures are fabricated on the source surface of the device suffer a geometrical limitation in that it is impossible to make the channel thickness much smaller than the emitter contact width. This limitation limits the current handling capability of these structures and also increases the parasitic series source resistance.

A primary object of the present invention is to provide a transistor device which incorporates the advantages of all of the above devices while avoiding their disadvantages. The device of the present invention has available power gain even at very high frequencies in the order of 500 GHz. The transconductance of the device increases exponentially with base bias at low bias levels. The power-delay product for the transistor can be two orders of magnitude lower, that is better, than for the best equivalently sized FETs. The device also consumes a small surface area and lends itself to stacked transistor configurations to reduce the chip area required for each logic gate circuit. Because of its excellent high frequency performance, the device also has high potential in microwave systems. The device has lower noise than either the FET or the bipolar transistor.

As already noted, miniaturization of integrated circuits is limited by circuit geometry as well as by the individual devices. In virtually all large scale integrated circuits, interconnections between devices are formed along one surface of the semiconductor chip. These interconnections must be large enough to provide a low resistance path; they thus require a considerable surface area. Also, with all contacts to the transistors at the chip surface, the transistors themselves must be surface devices; and that is a major limitation to prior circuits.

A further object of this invention is to provide a fabrication technique and circuit elements which permit stacking of devices with a reduction in surface area requirements.

DISCLOSURE OF THE INVENTION

The preferred transistor embodiment of the invention includes a metal base layer embedded in semiconductor crystal material to separate collector and emitter regions and form a Schottky barrier with each. The metal base layer has at least one opening therein through which a crystal semiconductor joins the collector and emitter regions. Ohmic contacts are made to the emitter and collector regions. The width of all openings in the base layer is of the order of the zero bias depletion width corresponding to the carrier concentration in the opening. The thickness of the metal layer is in the order of 10% of this zero bias depletion width. As a result, a potential barrier in each opening limits current flow over the lower portion of the bias range. With increasing forward base bias the potential in the openings, which is lower than that along the metal of the base layer, is lowered sufficiently to permit substantial increase in the barrier limited current flow from the collector to emitter.

In order to realize a very large ratio of transconductance to base emitter capacitance, the total opening area should be at least 10 percent of the total area of the metal base layer and preferably at least 50 percent, and the shape of the openings should be in the form of slits.

In one embodiment, a plurality of openings having uniform widths are uniformly spaced across the transistor device.

In another embodiment, a plurality of devices are formed on a single crystal and a single metal base layer. The openings of the devices have uniform widths for uniform operating characteristics.

The transistor embodying this invention may be formed with at least two sets of interleaved fingers forming the base layer. With each set connected to a separate input, a logic circuit, mixer, or gain control amplifier can be constructed.

In a method of fabricating the transistor device of the invention, a metal base layer is provided on a single semiconductor crystal. Slits are formed in the base layer to expose the underlying semiconductor crystal. The underlying single crystal is then further grown over the metal base layer.

The fabrication method can be extended to provide a unique integrated circuit structure. A layer of material can be selectively embedded in single crystal semiconductor by providing wide, continuous regions which are to be left exposed and narrow or noncontinuous regions which are to be embedded. The lateral crystal growth is not sufficient to embed the wide continuous regions, but the lateral growth across narrow regions and from openings in the noncontinuous regions is sufficient to totally embed those regions. By selectively embedding metal layers within a crystal, transistor devices, interconnections and isolating Schottky barriers can be formed in a crystal, but areas can be left exposed for interconnection to metal patterns formed over the newly grown crystal.

Using the selective embedding technique, devices can be stacked within the crystal with some interconnections totally embedded. By further providing semiconductor crystal of both n and p types, stacked complementary transistor circuitry can be fabricated.

The embedded interconnections may be extensions of metal base layers in transistor devices and of ohmic contacts. Preferably, the interconnections lie in isolation regions formed by bombardment of the semiconductor material by protons or heavier particles. In particular, the isolation regions are formed by proton bombardment of gallium arsenide.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3A is a schematic illustration of donor atoms and the depletion region in a section of the transistor devices of FIGS. 1 and 2 with no applied bias voltages, and FIGS. 3B-3G indicate the charge density, electric field and potential barrier for that device;

FIG. 4A is a schematic illustration similar to FIG. 3A after a collector to emitter biasing voltage is applied, and FIGS. 4B and C are potential barrier diagrams for that device;

FIG. 5A is a diagram of the potential barrier across the transistor of FIGS. 3 and 4 with a base to emitter bias voltage applied, and FIG. 5B is a corresponding maximum potential barrier diagram;

FIG. 6A is a diagram of the potential barrier across the device of FIGS. 3 and 4 with a high base to emitter bias applied, and FIG. 6B is a corresponding maximum potential diagram;

FIGS. 7A-7D are equipotential contour maps of a single cell of a device at no base voltage, low voltage, moderate voltage and high voltage;

FIGS. 9A-9D are contour maps of constant current density for the component of current flowing normal to the emitter contact corresponding to the conditions of FIGS. 7B-7D;

FIG. 37 is a cross sectional view of a module during fabrication similar to that of FIG. 36 but with the metal base layer shadow deposited to form angular base fingers;

FIG. 38 is a cross section of a module during fabrication in which an amorphous crystal layer is deposited over the metal base layer and then recrystallized to form the single crystal structure;

FIG. 39 is a cross section of a module during fabrication in which tapered fingers having a cross section are deposited in etched grooves in the semiconductor crystal and then overgrown with semiconductor material;

FIG. 40 is a circuit diagram of a known direct coupled logic circuit including two inverters in series;

FIG. 41 illustrates a step in the fabrication of the circuit of FIG. 40 in which the base regions are formed on the semiconductor substrate;

BEST MODES OF CARRYING OUT THE INVENTION

Figure 1:
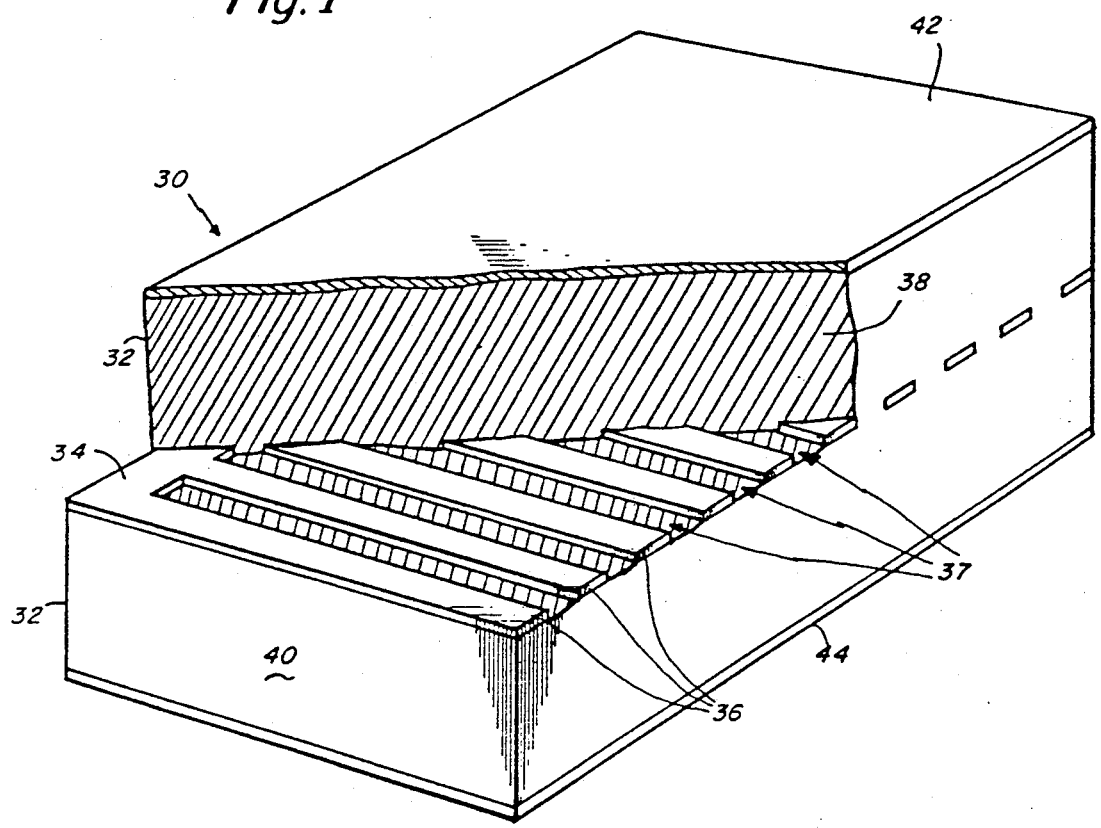
FIG. 1 is a perspective view, partially broken away, of a transistor device embodying the present invention.
Figure 2:
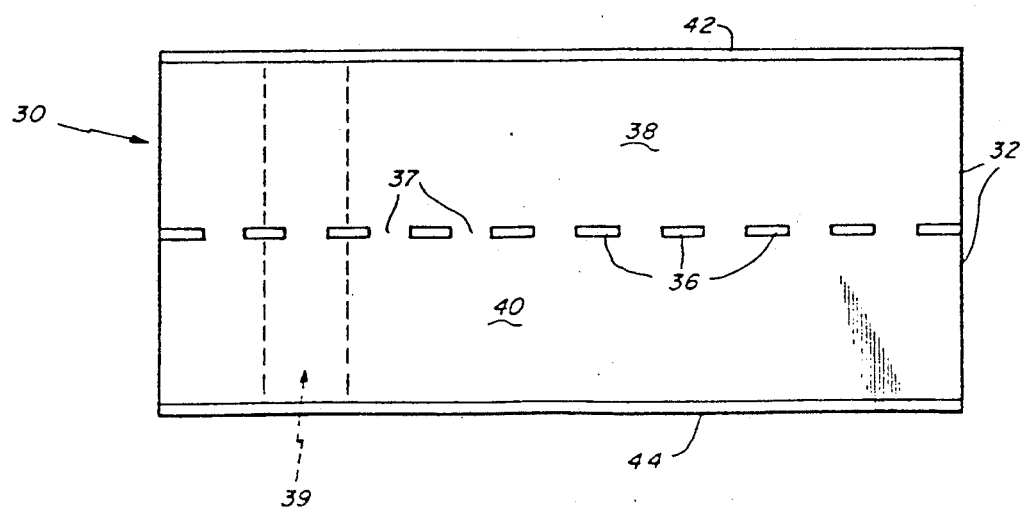
FIG. 2 is a side view of the transistor device of FIG. 1 as viewed from the right of that figure.

A permeable base transistor (PBT) 30 embodying the present invention is shown in FIG. 1 and 2. It comprises a single crystal semiconductor 32 in which a metal base layer 34 is embedded. The metal base layer includes a plurality of uniform and electrically connected fingers 36 spaced by openings 37 to form a grate. The openings are filled with the host semiconductor. The metal base layer 34 and regions 37 separate the single crystal 32 into a collector region 38 and an emitter region 40. Collector and emitter ohmic contacts 42 and 44 are applied to the outer surfaces of those regions.

The semiconductor crystal 32 is doped with a donor impurity so that it forms an n-type semiconductor. The metal base layer 34 provides an equipotential surface which forms a Schottky barrier with the crystal as can be best understood with reference to the illustration of FIG. 3A. A positive fixed charge is provided by the ionized donor atoms and current is carried by electrons.

There is a well understood and generally accepted tendency for the electrons near the metal base layer 34 to migrate into the metal until equilibrium is reached between the metal and the semiconductor. As a result, a region largely depleted of electrons and having only the positive space charge of the donor ions is formed. This is the region between the broken lines in the illustration of FIG. 3A. Outside of this depleted region a transition is made to an electrically neutral region in which both electrons and donor ions exist in equal numbers. The resultant net charge density along a section through a metal finger is illustrated in FIG. 3B. As shown, the electrons which have migrated into the metal cause the metal to be negatively charged; whereas the positive ions remaining in the crystal cause the crystal to be positively charged.

An electric field is created by these two charge regions as indicated by the small field lines in FIG. 3A and by the electrical field diagram of FIGS. 3D and 3E. The electrical field lines from the ions in the emitter region 40 result in a positive field (left-to-right), whereas the field lines from the ions in the collector result in a negative field. Because the direction of the force is opposite to that of the electric field for negative charges, it can be seen from FIG. 3A that the electric field in both the emitter region 40 and the collector region 38 acts to repel the negatively charged electrons from the base. This repelling of charge carriers can be seen as the potential barrier of FIG. 3F. The potential barrier from the metal extends across a depletion width $W_D$.

The width of openings 37 between the metal fingers 36 is on the order of the zero bias depletion width. Thus, the effect of the barrier extends across the semiconductor regions in the openings 37 for a base to emitter bias ranging from large reverse bias to moderate forward bias depending on the opening size and the carrier concentration therein. However, as shown in FIG. 3F, the barrier height between the emitter and collector is less in the regions 37 than it is at the surface of the metal fingers. This change in maximum barrier height in the semiconductor along the base layer is illustrated in FIG. 3G. The maximum barrier is along the metal surface and then through the center of the regions 37. As can be seen in FIG. 3G, there are depressions in the potential barrier at each of the openings. The depressions do not drop to zero potential; but since the opening width is in the order of the zero bias depletion width there does result a significant reduction in potential in those openings.

As will be shown, like the bipolar transistor, this device controls the current with a barrier. Thus, the conventional notation for the bipolar transistor has been adopted—the three terminals are labeled emitter, base and collector. For a device using n type semiconductor, the common emitter configuration is used in this description, and positive or negative voltages applied between base and emitter ($V_{BE}$), are referred to as forward (positive) or reverse (negative) base voltage, respectively. For an n-type device low base voltages are the least positive or most negative which give low collector current. Similarly the voltage applied between collector and emitter ($V_{CE}$) is positive for an n-type device and is referred to as the collector voltage. Base and collector voltage may also be termed base and collector bias.

When a positive voltage is applied to the collector, and with base voltage ranging from large negative to moderate forward bias levels, the electric field and the depletion width in the collector region 38 become larger as shown in FIG. 4A. For moderate collector voltage the potential barrier created by the metal base 36 remains and allows only the electrons with sufficient thermal energy to flow through from emitter to collector. Consequently, the current is limited by the potential energy barrier which is controlled by the base to emitter voltage. Both the emitter depletion region and the barrier height are reduced slightly by increases in the collector voltage, but at moderate collector to emitter voltages they are still sufficiently large to provide the barrier indicated in FIG. 4B and FIG. 4C. It is only at relative high collector voltages that the barrier resulting from the base layer can be reduced sufficiently to permit substantial amounts of electron flow through the openings in the metal base.

With a moderate collector voltage, the device operation can be classified into four modes with respect to base voltage. At sufficiently low base voltage levels (mode 1) the collector current is limited solely by the potential barrier in the openings between emitter and collector. For much more positive values of applied base voltage (mode 3) the collector current is limited primarily by the accumulation of a negative space charge on the collector side of region 37. Mode 2 is the intermediate operation between modes 1 and 3 where collector current is limited by a combination of a substantial potential barrier and negative space charge. Finally in mode 4 the base is forward biased to the point where more than 5% of the emitter current flows into the base metal.

As voltage is applied to the metal base layer with respect to the emitter, the potential barrier is reduced as shown in FIGS. 5A and B. With the application of only a relatively small base voltage (mode 1) the potential at the center of the openings is reduced and a large number of electrons can diffuse over the barrier. For example, a change in the base to emitter voltage of 0.1 volts will increase the current by a factor of approximately twenty depending on the specific device design. In fact, because of the Maxwell-Boltzmann energy distribution of the electrons, the current flow varies exponentially with small forward changes in base to emitter voltage.

At higher base voltages (mode 3), the potential barrier at the center of regions 37 vanishes as shown in FIGS. 6A and 6B. At that point, the current flow from the emitter to the collector becomes space charge limited; that is, the accumulation of negative charge on the collector side of region 37 acts as a retarding force on additional electron flow from the emitter contact. It should be noted that in this mode of operation, there is still a current limiting depletion region surrounding the metal of the base layer and there is little flow of electrons toward that metal. The current flow into the base metal is thus negligibly low and the ratio of collector current to emitter current remains near unity. Only at exceptionally high base biasing voltage (mode 4) is the emitter depletion region reduced sufficiently so that there is high electron flow into the base metal. For modes 1 and 2 the ratio of collector current to emitter current ($\alpha$) is essentially 1, while for mode 3 the $\alpha$ may drop to 0.95, and for mode 4 $\alpha$ is below 0.95.

The four modes of operation can be understood in more detail by looking at contour maps of the electron potential of a typical device, FIGS. 7A-D. Each of the diagrams shows the cross-section of one cell of a device 39 in FIG. 2. A voltage of +1 volt has been applied to the collector in each of FIGS. 7A-D. The base voltage has been adjusted to 0, 0.3, 0.4, 0.5 volt in FIGS. 7A-7D, respectively. The contour lines give the electrical potential in volts, and a negative potential indicates an electron barrier. In FIG. 7A and B there is an electron barrier for a base voltage of zero and 0.3 volts. In FIGS. 7C and 7D, there is a barrier only along the edges of the opening.

Figure 8A:
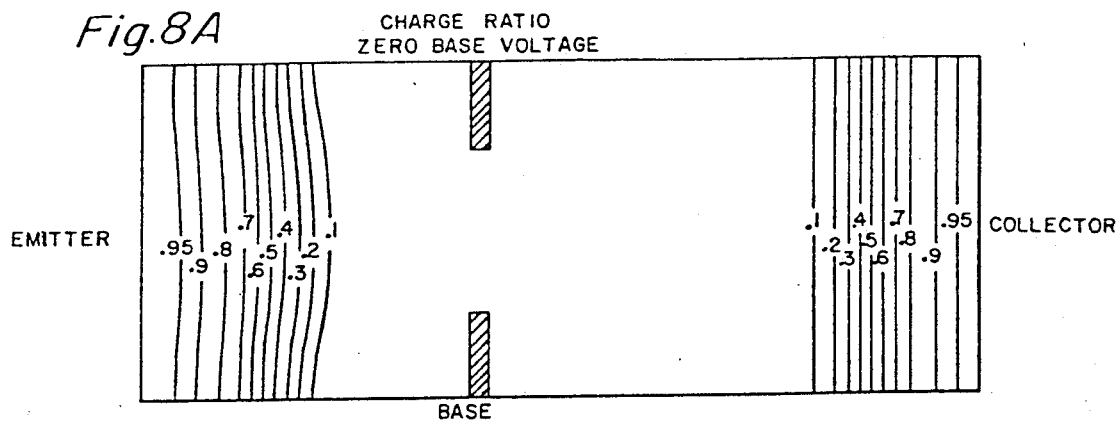
FIGS. 8A-8D are charge ratio contour maps corresponding to the conditions of FIGS. 7A-7D.
Figure 8B:
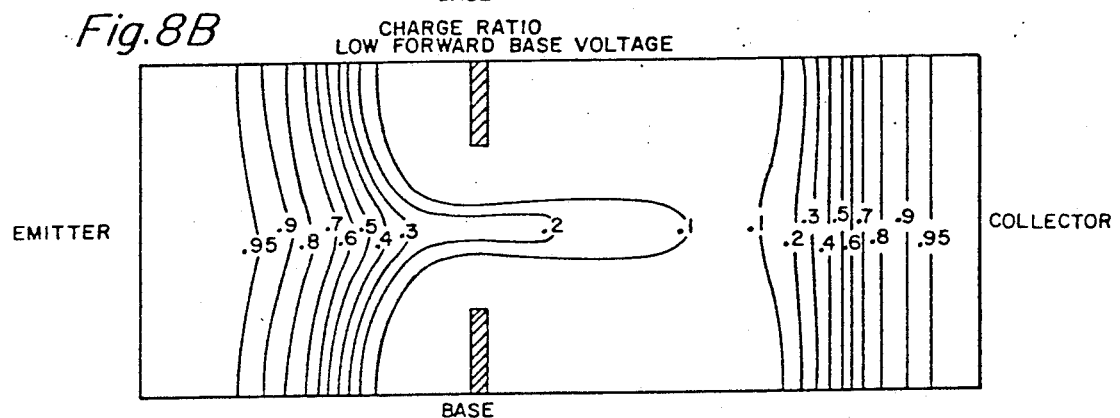
Figure 8C:
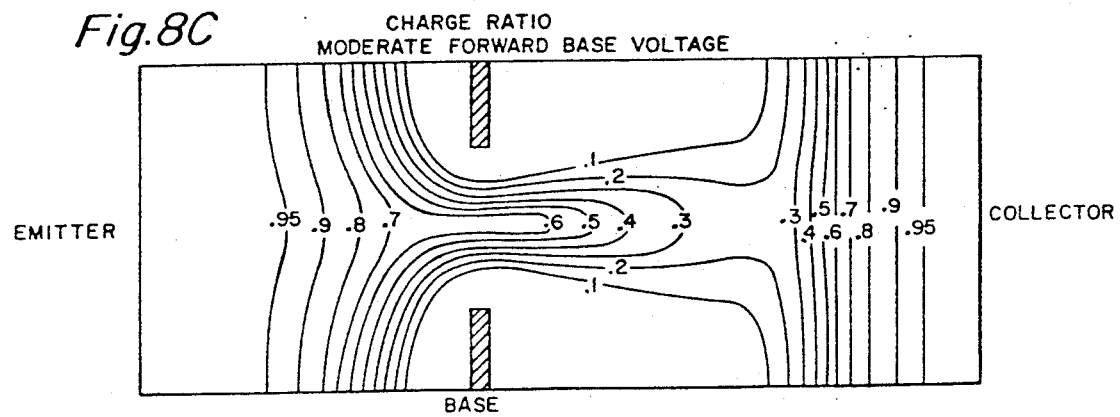
Figure 8D:
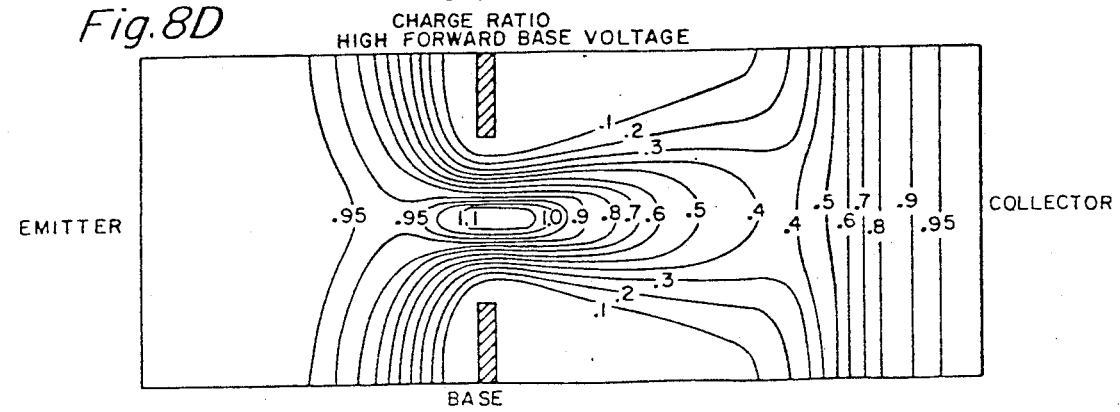

The space charge accumulation effects can be seen in detail from the contour maps of the ratio of electron charge to donor ion charge given in FIGS. 8A-D. FIGS. 8A-D are for bias conditions identical to FIGS. 7A-D. A charge ratio of zero represents a charge depleted region, and a charge ratio of 1 represents a neutral region. In FIG. 8A, with no base bias, the regions near the collector and emitter contacts are neutral, having a charge ratio of 1, whereas the region around the metal is depleted, having a charge ratio of near zero. With reference to the previous qualitative discussion, the zero bias emitter depletion width can be loosely defined as the distance from the metal base layer to that part of the emitter region having a charge ratio of 0.95 in FIG. 8A. More precisely, the depletion width can be defined for n type semiconductor as $$W_D = \sqrt{\frac{2\epsilon_r \epsilon_0}{q N_D}\left(V_{bi} - V - \frac{KT}{q}\right)}$$

where
$\epsilon_r$ = dielectric constant
$\epsilon_0$ = permittivity of free space
$q$ = charge of an electron
$N_D$ = donor concentration
$V_{bi}$ = built in voltage
$K$ = Boltzmann constant
$T$ = absolute temperature
$V$ = applied bias voltage For gallium arsenide at room temperature, this equation can be reduced to $$W_D = 3.787 \times 10^7 \sqrt{\frac{V_{bi}}{N_D}}$$

where $N_D$ is given in donor atoms per cubic centimeter, built in voltage $V_{bi}$ is given in volts and $W_D$ is given in micrometers. The built in voltage is about the same as the Schottky barrier potential and is typically 0.7 volts.

As an increasing forward voltage is applied to the base, FIGS. 8A-D, more and more electrons accumulate in the collector region. This accumulation limits the diffusion of electrons through the opening even though there is no longer a significant barrier in FIGS. 8C and D. The accumulation also reduces the electric field which could otherwise tend to help pull electrons through the opening; therefore, the flow of carriers is termed space charge limited. When space charge limited, the collector current no longer increases exponentially with base bias as it does in the barrier limited mode.

FIGS. 9A-D gives the component of the current density ($\times 10^3$ amp/cm$^2$) in the direction from emitter to collector corresponding to the respective FIGS. 7 and 8. As was described earlier, only a small current can pass over the barrier for relatively high barrier heights. As increasingly forward voltage is applied to the base, the current density increases. Also it is apparent that the width of the current conducting region increases and the electron barrier around the metal is reduced.

It can be seen from the above discussion that the width of the semiconductor region 37 is critical to the operation of the permeable base transistor.

Figure 10:
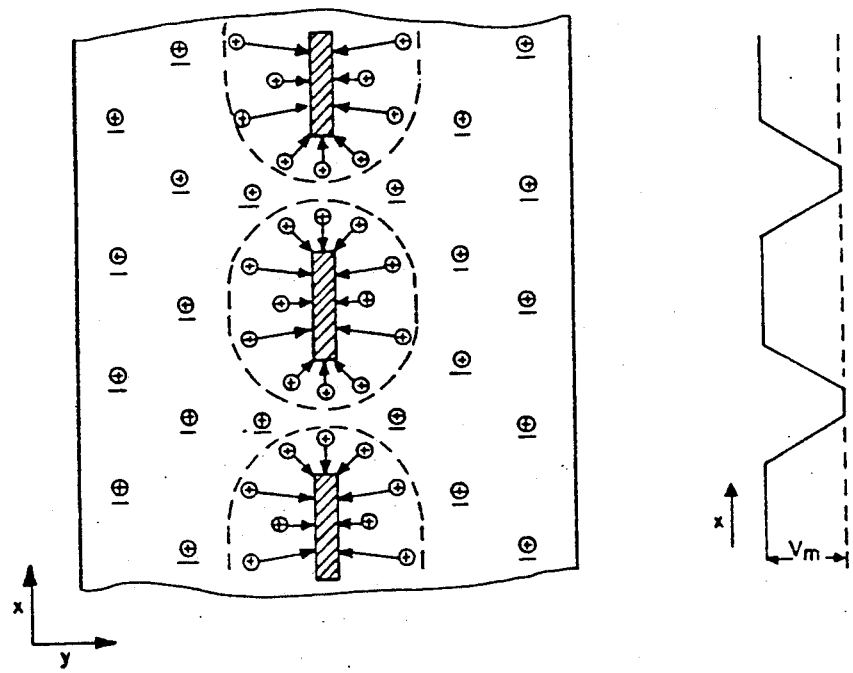
FIG. 10 is a schematic illustration similar to FIG. 3A for a device having a slit which is too wide for barrier limited current flow at zero base voltage.

As shown in FIG. 10, if the opening width for the metal base layer were substantially greater than twice the zero bias depletion width of the Schottky barrier, there would be a channel region through the opening which would include a significant number of mobile charge carriers at zero base voltage, and significant current would flow at low collector voltage levels. If the opening were not too wide, the application of reverse base to emitter bias could cause a barrier to form across the opening and thus limit the collector current flow. But if the opening were too large, avalanche breakdown would occur in the region of the opening before the barrier could form. The opening width must therefore be sufficiently small so that at the most negative desired operating base voltage and at low collector voltage all points in the opening are within the depletion region of the Schottky junction. Otherwise, collector current flow would not be barrier limited.

On the other hand, the width of region 37 must be sufficiently large to ensure high, barrier-limited current flow therethrough with virtually no current flow into the base metal. This results in a high ratio of collector current to emitter current, that is an $\alpha$ of about one. A large forward base voltage does reduce the barrier enough for space charge limited flow to occur, but the very high collector current level and transconductance achieved with the barrier limited flow in modes 1 and 2 is not then lost when moving into mode 3. Finally, it is recognized that at extremely high base voltage, the base current will flow into the base metal and $\alpha$ will degrade rapidly.

It is important that substantially all openings in the base layer have nearly the same width. Too close spacing between any pair of fingers 36 would result in only a very small depression in the potential barrier at that opening, and little current would flow through that opening relative to the other openings. Thus, any region of the device having an opening with a lesser width would contribute a relatively small transconductance but would still add to the base-emitter capacitance of the device. This would degrade the high frequency performance of the device.

Although the absolute limits of the slit, or opening, width are dependent on a number of variables, it can be said that as the opening width is reduced to 10% of the zero bias depletion width of the semiconductor in the region of the opening 37 the high $\alpha$ of the device is lost at high collector current densities. As the width is increased to over twice the zero bias depletion width of the metal semiconductor Schottky barrier, the potential barrier in the opening at zero base to emitter bias is lost and the transconductance of the device becomes relatively small. Within those limits, the width is in the order of the zero bias depletion width.

Within the above range, the slit width should be precisely controlled to provide the desired operating characteristics of the device. In particular, for a high gain, high frequency device, the slit width must be less than about one zero bias depletion width.

If one defines the saturated collector current as the value of collector current where drops to 0.95, for a fixed grate period, increasing the opening width increases the saturated collector current. Also, an increased slit width decreases the threshold base voltage for a given collector threshold current and decreases output impedance.

A power amplifier requiring negative base voltage for cutoff can be constructed by providing many slits with an equal and uniform slit width of near twice the zero bias depletion width. In that case, at zero base voltage a collector voltage can draw barrier limited current through the slits. Negative base voltage can increase the potential barrier through mode 1 operation to a virtual current cutoff. Positive base voltage decreases the barrier further for even greater current flow in operating modes 2 and 3.

Another parameter which effects the device characteristics is the carrier concentration. As that concentration increases the saturated collector current increases. The threshold base voltage for a given threshold collector current decreases with increased concentration because the potential barrier at the center of the opening is reduced. High carrier concentration reduces output impedance and decreases transconductance while increasing collector current. Various impurity concentration gradients within the semiconductor material may improve or degrade performance. For example, the carrier concentration can be reduced at the base grate by ion implantation. This increases the depletion width. Dimensional related pattern noise which causes current nonuniformity can then be reduced by increasing the dimensions of the device. Or the dimensions can be left small to increase $f_T$ and $g_m$ at a loss of maximum saturated current density. By increasing the carrier concentration in the emitter relative to the collector, the transconductance of the device may be increased. By decreasing the collector carrier concentration, the output impedance may be increased.

This thickness of the metal base layer is another important design parameter. A thick metal layer advantageously reduces base resistance; and a low base resistance is necessary to ensure that the entire layer becomes more nearly like an equipotential surface. Unfortunately, the thicker metal layer causes a thicker barrier, and that decreases the transconductance of the device because of the two dimensional effects in the region of the opening 37. However, a thicker base layer also increases output impedance which may be desirable in some applications. If the thickness is greater than the zero bias depletion width in the semiconductor in the region 37, transconductance is too low. For optimum unity current gain frequency $f_T = g_m/2\pi C_{be}$, the base metal thickness should be less than 10% of this zero bias depletion width of the semiconductor of region 37. The unity current gain frequency, $f_T$, monotonically increases with decreasing base thickness; but at a thickness of less than 1% of the zero bias depletion width base resistance will very likely be too high. Thus the base layer thickness should be between 1% and 100% of the zero bias depletion width; that is, it should be in the order of 10% of that width.

With a very thin base layer, electrons may be injected through the metal fingers as well as through the barrier between the fingers. Thus the device operates as a barrier limited device but also demonstrates the operation of a conventional metal base transistor. This current flow through the metal allows for increased current flow.

The transconductance of the device is primarily dependent on the thickness of the base metal immediately adjacent the opening 37. Thus the base resistance can be held low while maintaining a high transconductance by tapering a thick metal base to provide sharp edges along the opening (FIG. 39).

The thin metal base layer is an important distinguishing feature of this device over the FET. The length of the conventional FET gate region is large relative to the channel thickness. During normal operation, the channel region is partially depleted, and that length of semiconductor material which is not depleted acts as a variable resistance element. A barrier across the gate region only forms at cutoff. The resistance value is inversely related to the thickness of the charge carrying channel formed between depleted regions. With the present device, the resistance through the openings is kept to a minimum by using a thin metal layer. Current is controlled over a large part of the dynamic range by a potential barrier, not by the channel thickness of a length of conducting semiconductor material.

Computer analyses of short gate-length field effect transistors have been made. They indicate that as one reduces the channel length in an FET, current flow through the channel becomes space charge limited and thus less responsive to the gate voltage. This results in a decreasing transconductance $g_m$, or gain. By reducing the gate length of an FET to less than one-half its width, one would only expect a very low transconductance, $g_m/I_c$, which is a measure of the ratio of gain to input power.

The transconductance can be increased while decreasing the base resistance by cooling the device as by cryogenics.

The very poor short-gate FET can be redesigned in accordance with this invention to provide a PBT with its exceptional performance characteristics. If one considers an analysis in which the length of an FET gate is reduced to less than half its open channel thickness, the normalized transconductance drops to a very low number much less than one volt$^{-1}$. The analysis can then be continued to produce a PBT by properly dimensioning the opening in the metal base layer and the thickness of that layer and by providing a proper carrier concentration in the semiconductor. Having seen the normalized transconductance drop to such a low level, one can observe an increased normalized transconductance as the device begins to behave as a PBT. The decrease and increase in normalized transconductance results from the shift from a variable resistance mode of operation, through a space charge limited mode, to a barrier dominated mode of operation. The increase in normalized transconductance to a value over about two volts$^{-1}$ with a thin metal layer can be seen as a measure of the relative effect on current of the Schottky barrier and charge accumulation. One can then consider the PBT to be a device in which the thickness of the metal base layer is no greater than one-half the width of the base opening and which further has a sufficient barrier limitation on current flow to provide the normalized transconductance of at least two volts$^{-1}$.

From the above analysis it can be seen that a device need not have a complete barrier at zero base bias. Some reverse biasing may be required to build the barrier at the center of an opening. Such a device would likely have a relatively low normalized transconductance, about two volts$^{-1}$, but that transconductance is enough to indicate significant barrier effect. That barrier effect would make the device better than one which is primarily space charge limited, as indicated by the improved normalized transconductance. The normalized transconductance can be further improved toward a theoretical limit by decreasing the dimensions or the carrier concentration. That theoretical limit is believed to be about 40 volt$^{-1}$.

Another important design parameter is the percent of open area in the total area of the metal base layer across the active portion of the device. If the total area of openings is less than about 50 percent of that total base area, the base-emitter capacitance, $C_{be}$, becomes large relative to the transconductance. The ratio of transconductance to base emitter capacitance $C_{be}$, is an important factor in determining the speed of the device. At about 10 percent open area, the PBT has a frequency response comparable to that of the best FETs.

Other dimensions worth noting are the emitter thickness and the collector thickness. The emitter thickness should be greater than the depletion width at all operating conditions so that the charge ratio increases to one inside the crystal without being influenced by the emitter ohmic contact. If the emitter contact were closer to the base layer, it might squeeze the depletion area and thus increase the emitter capacitance of the device. If, on the other hand, the emitter thickness were increased substantially beyond the depletion width, the emitter resistance might be unduly increased.

The collector region 38 should be sufficiently thick that the collector contact does not disturb the collector depletion region at the maximum collector voltage. A collector which is too thin may reduce output impedance, increase collector capacitance, and reduce the maximum collector voltage.

As stated, the performance of the device depends on the dimensional parameters of base metal thickness, grating period, slit width and thickness of the semiconductor above and below the base metal and also on the carrier concentration. If the above dimensional parameters are decreased by the same factors and the carrier concentration is increased to maintain a constant product of length times the square root of carrier concentration, then the unity current gain frequency, $f_T = g_m/2\pi C_{be}$ increases as the 0.85 power of the carrier concentration. If, in addition, the length of the base fingers is scaled with the other dimensional parameters, the maximum frequency of oscillation increases with carrier concentration in the same way. From this, it can be seen that for optimum performance at high frequencies, a high carrier concentration together with small physical dimensions are required.

A significant feature of the device thus far described is that the openings are in the form of slits to define a grate. Other opening arrangements such as holes in a mesh are practicable; however, such arrangements may not offer the high transconductance to capacitance ratio of the grate. As compared to a mesh, the slits provide a very high percentage of open area in the total base area. Thus there is a larger area of high current density but barrier limited current flow is maintained. The slits need not be linear, but may be concentric circles or any other pattern.

Examples of metal grate base layers for various carrier concentrations in gallium arsenide semiconductor material include the following. For a concentration of $4\times10^{14}$ electrons per cubic centimeter, a grate may include one micrometer strips 1000 Å thick with opening widths of one micrometer. For a carrier concentration of $1\times10^{16}$, the grate may include strips having widths of 2,000 Å with a thickness of 200 Å spaced by 2,000 Å openings. For a carrier concentration of $1\times10^{18}$, 200 Å slits 20 Å thick, spaced by 200 Å openings are suggested. The suggested dimensions for a silicon device would be close to those for gallium arsenide.

Figure 11A:
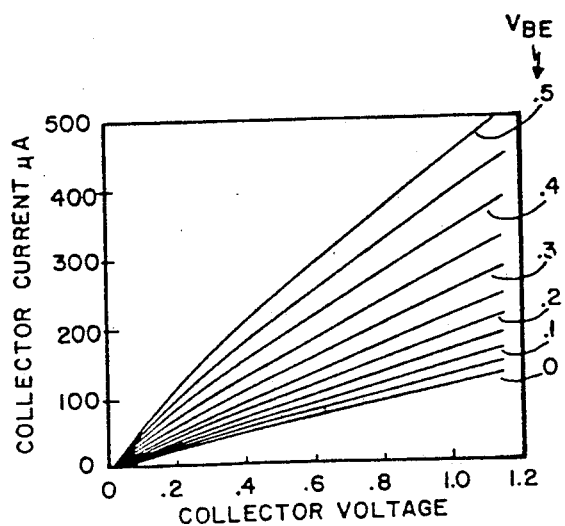
FIGS. 11A-11C are graphs of the actual collector characteristics of two tested transistors embodying the present invention.

An early sample of a gallium arsenide (GaAs) permeable base transistor (PBT) embodying this invention has been tested and found to have the collector characteristics shown graphically in FIGS. 11A and B. The characteristics of a more recently tested device are shown in FIG. 11C. It can be seen from those graphs that the transconductance of the device increases exponentially with collector current which can occur only if there is barrier limited flow. The devices operated at low collector current with an α of 0.998.

Figure 12:
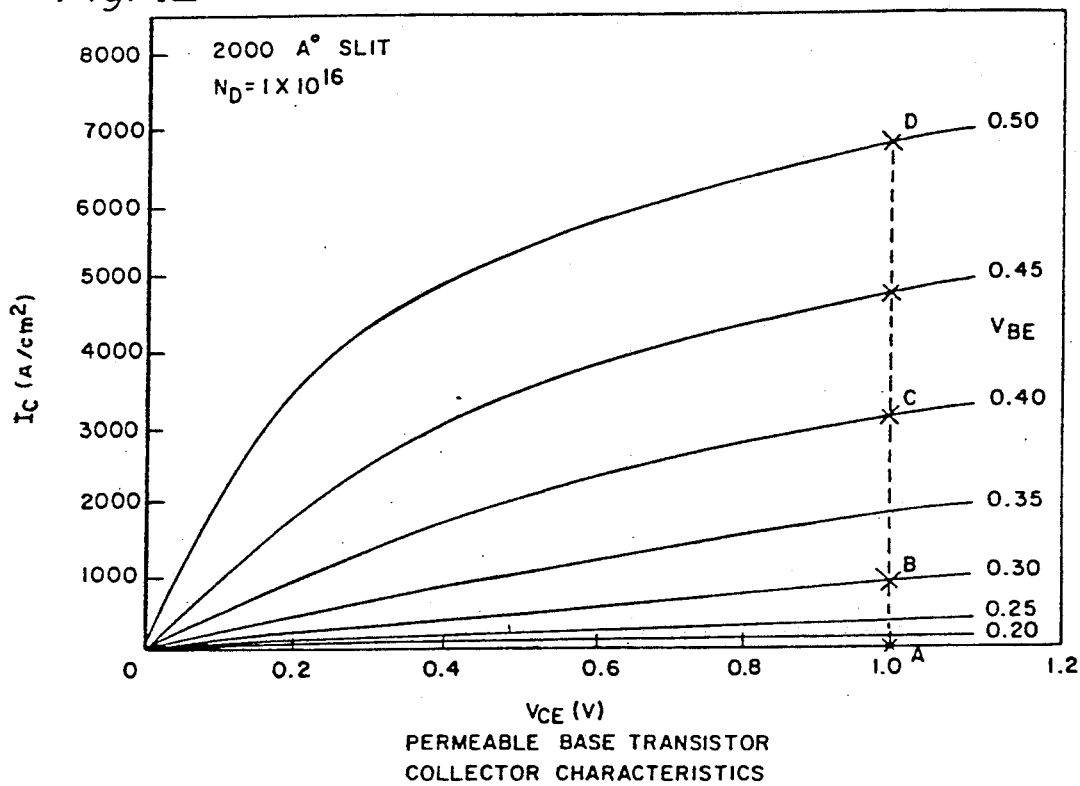
FIG. 12 is a graph of the collector characteristics of the device according to computer analysis of a model of the device.

A computer analysis based on Poisson's equation, the current flow equation, the continuity equiation, and a range of assumed velocity field relations for gallium arsenide indicates that collector characteristics as shown in FIG. 12 can be attained in future devices. Points labeled A, B, C, D correspond to diagrams A–D of FIGS. 7, 8 and 9.

Figure 13:
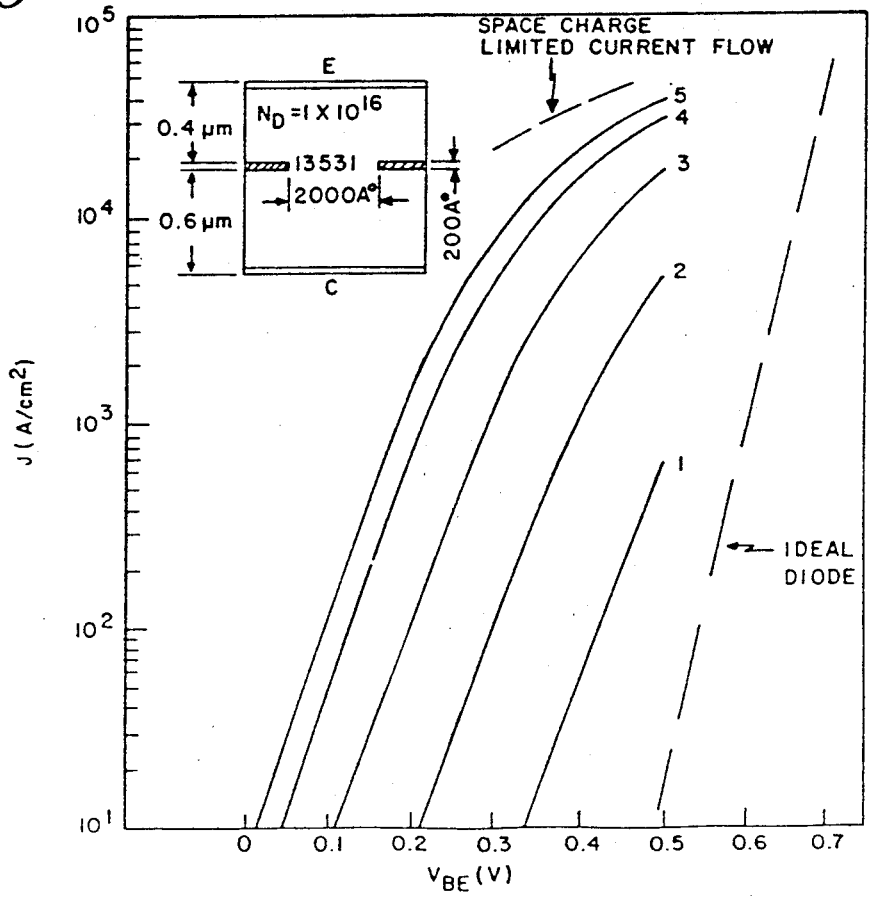
FIG. 13 is a graph of current density in the metal base void according to computer analysis.

The same computer analysis provides the FIG. 13 graph of current density against base to emitter voltage across a base opening. The current density is on a logarithmic scale; thus the straight lines below about $10^4$ amps per square centimeter ($A/cm^2$) indicate an exponential increase in current density with base voltage over a large dynamic range. At about $10^4$ $A/cm^2$, the current density near the center of the opening begins to demonstrate a lesser increase with base voltage. This is an indication that the current density at this point becomes space charge limited rather than barrier limited.

Figure 14:
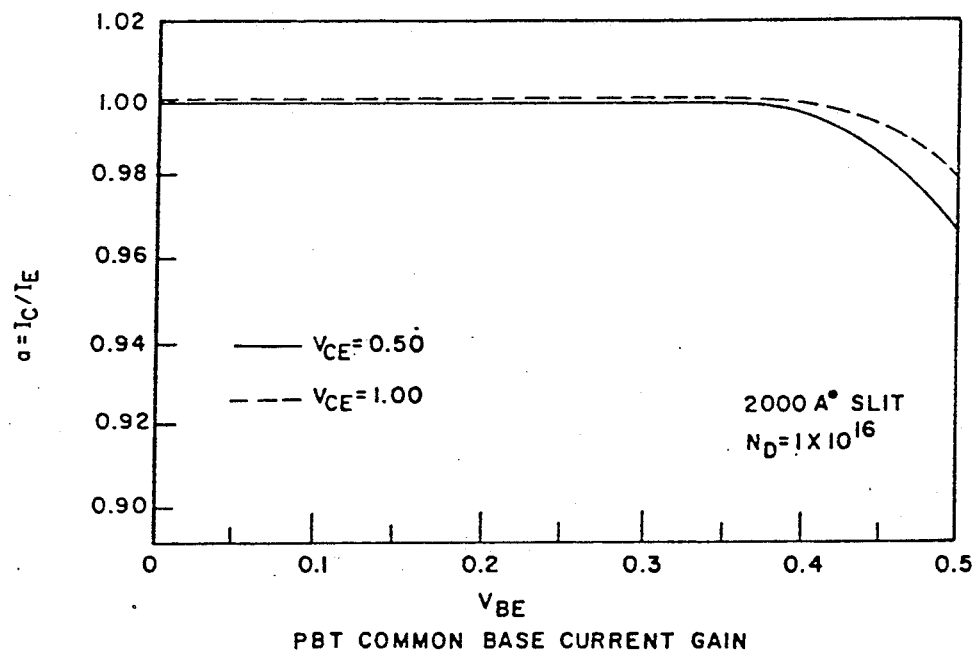
FIG. 14 is a graph of the α factor of the device according to computer analysis.

The high current gain of the device according to the computer analysis is shown in FIG. 14. It can be seen that the ratio of collector current to emitter current remains very near one up to at least 0.5 volts of base to emitter bias.

Figure 15:
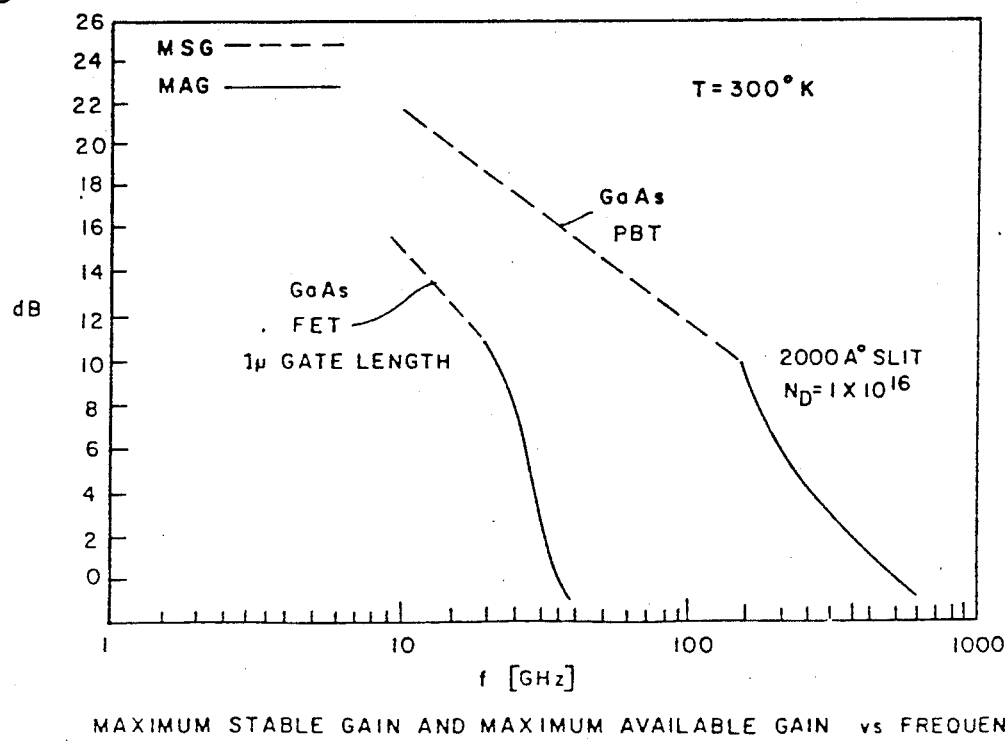
FIG. 15 is a graph of gain verses frequency comparing transistor performance to that of an FET according to computer analysis.

The computer analysis also indicates a very high gain over a wide frequency range. As shown in FIG. 15, the maximum stable gain (MSG) and maximum available gain (MAG) are substantially better than the best prior gallium arsenide FET's of comparable current carrying capability.

Finally, for an assumed logic inverter gate the analysis suggested a power-delay product, that is the product of propagation delay and power dissipation per gate, of less than one femto-Joule.

Figure 16:
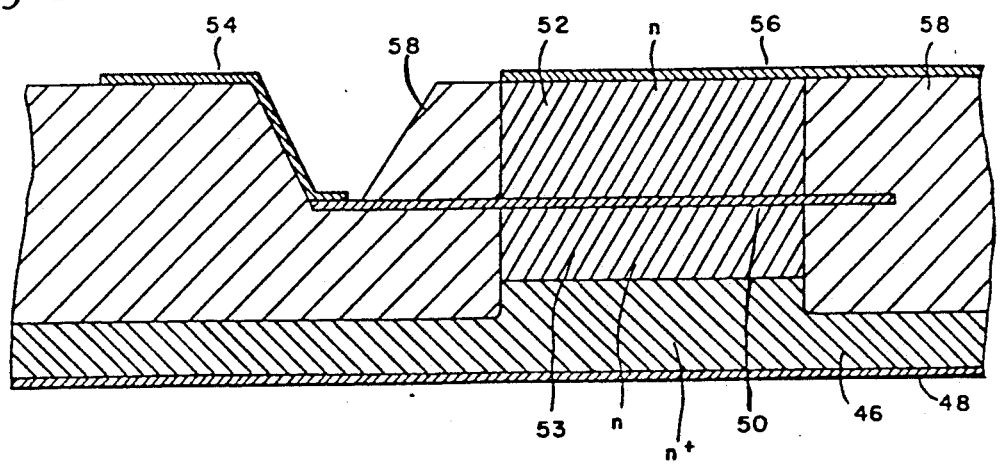
FIG. 16 is a cross sectional view of a preferred form of a single transistor device.
Figure 17:
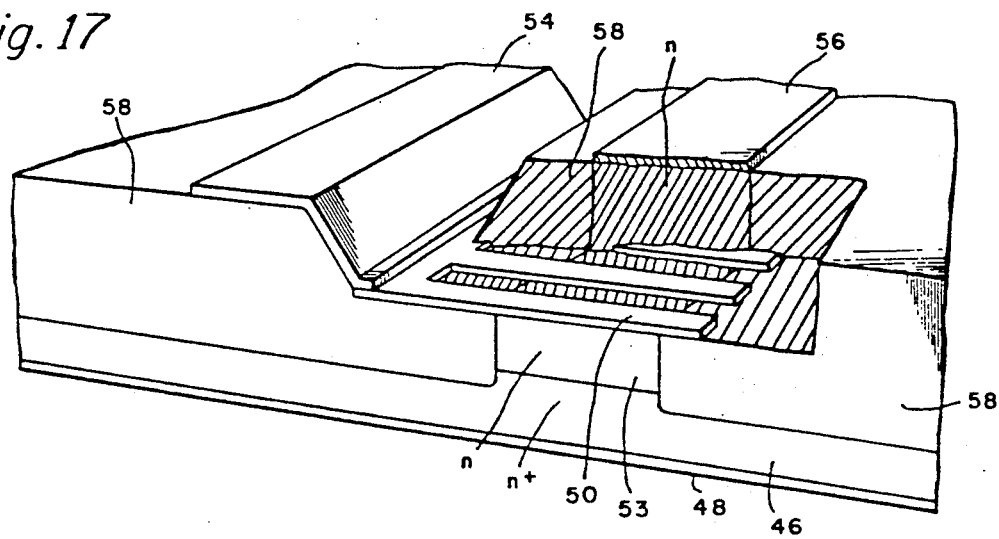
FIG. 17 is a perspective view of the device of FIG. 16, partially broken away.

A preferred single transistor configuration is shown in FIGS. 16 and 17. In this device, an emitter contact 48 is applied to a heavily doped n+ region 46 to form an ohmic contact. As before, a metal base grate 50 is embedded in the n-doped semiconductor crystal to divide collector and emitter regions 52 and 53. Contact is made to the base layer by base contact 54, and ohmic contact 56 is provided for the collector region. The collector contact 56 may be connected to other transistor devices in a multitransistor module in a common emitter configuration. To isolate this transistor device from others in the module, the gallium arsenide crystal is proton bombarded to form the insulating region 58 surrounding the emitter and collector regions 52 and 53. This means of isolating the transistors makes gallium arsenide a preferred semiconductor material, as does the high mobility and high peak velocity of electrons in that semiconductor.

Figure 18:
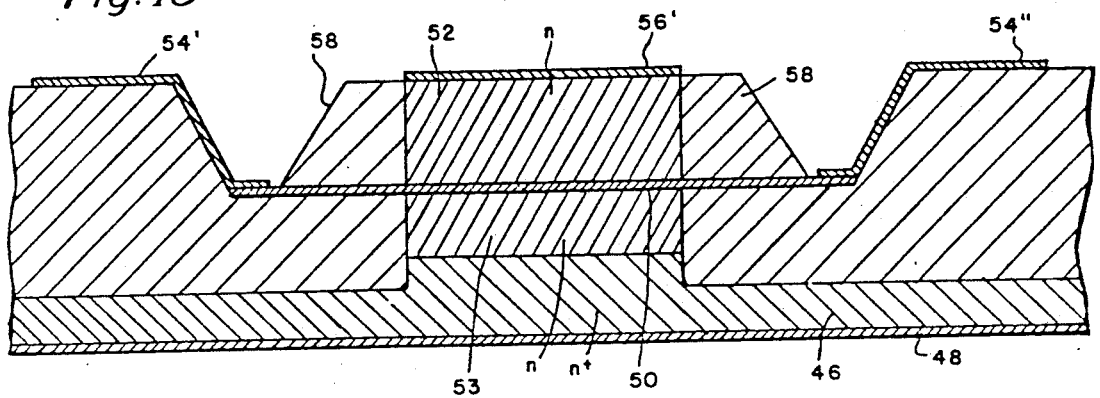
FIG. 18 is a cross sectional view of a modified form of the single transistor device in which base leads are connected at each end of the base fingers.
Figure 19:
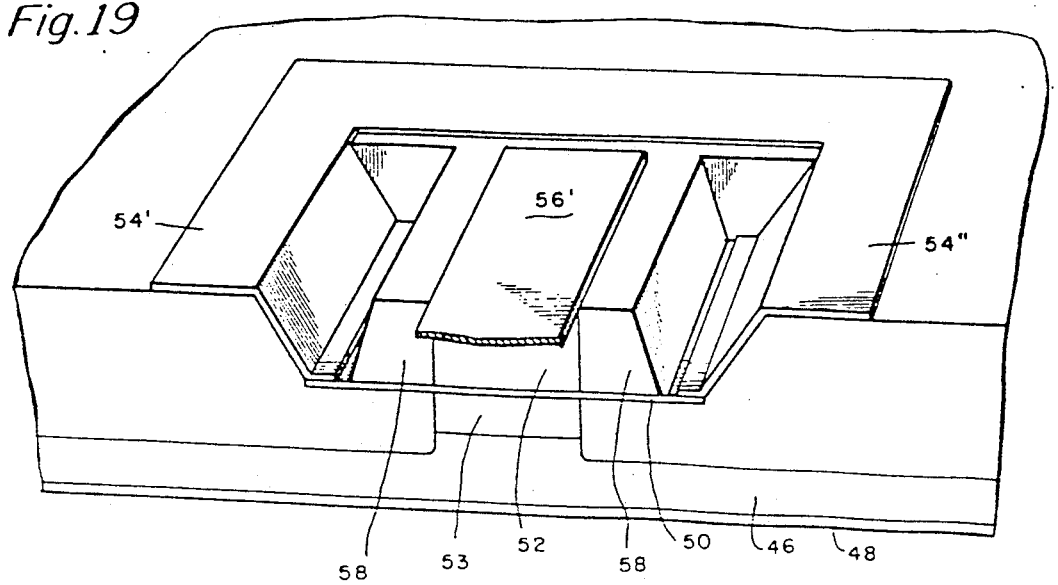
FIG. 19 is a perspective view of the collector and base leads to the device of FIG. 18.

In modified form of the transistor device shown in FIGS. 18 and 19, base contacts 54' and 54" are connected to opposite ends of the metal base grid 50. These contacts are connected in common to one side of the device as shown in FIG. 19. This arrangement reduces base resistance and the collector-to-base feedback capacitance of the device.

Figure 20:
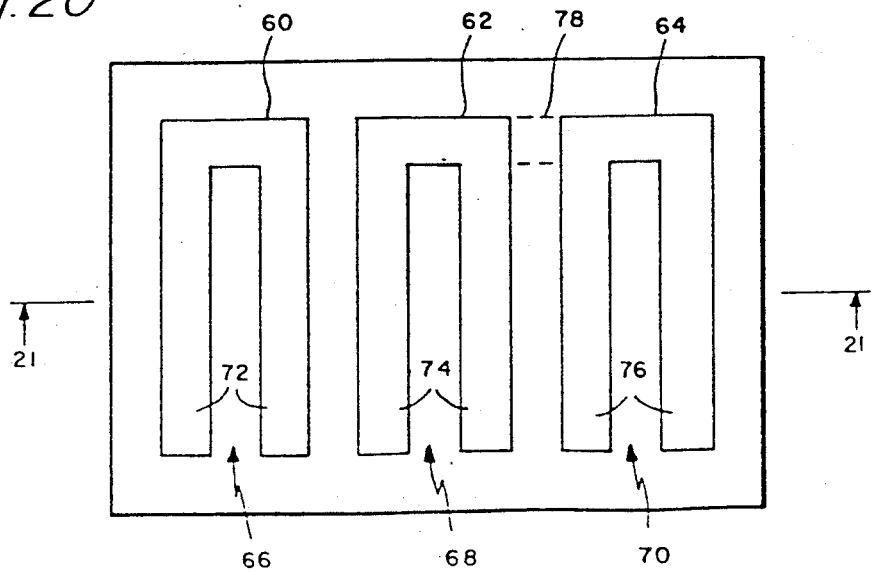
FIG. 20 is a plan view of the metal base layer of a three transistor module.
Figure 21:
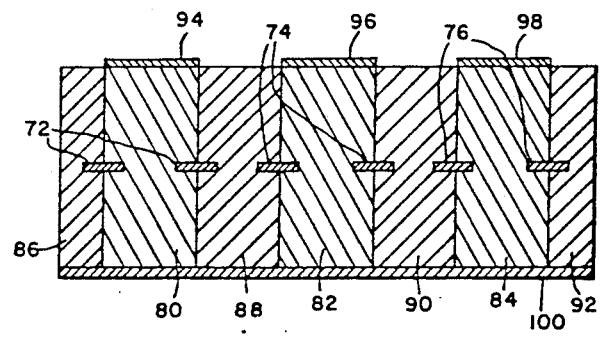
FIG. 21 is a cross sectional view of a transistor module having the metal base layout of FIG. 20.

By arranging the metal base layer as shown in FIG. 20, an integrated circuit module having a plurality of transistor devices can be formed as shown in FIG. 21. Each transistor device of the integrated circuit includes a metal base layer embedded within a single crystal to separate the crystal into emitter and collector regions. The base layers 60, 62 and 64 include respective slits 66, 68 and 70 defined by fingers 72, 74 and 76. If any two transistors are to have the bases connected in a circuit, a connecting strip 78, shown in broken lines in FIG. 20, may be provided. The respective active regions 80, 82 and 84 of the three transistor devices are isolated by proton bombarded regions 86, 88, 90 and 92. Isolation may also be provided by bombardment with other heavy particles.

As in the previous embodiments, the width of the slit is in the order of the emitter depletion width at the Schottky barrier. For uniform performance, it is important that the various transistor devices of a module which have the same function have equal, uniform slit widths and equal carrier concentrations. To provide scaled currents in selected devices, the lengths of the metal base fingers and the corresponding dimension of the active region can be varied. For example, by increasing the length or number of the fingers 72 the current flow through that transistor can be increased without changing the current density or other operating characteristics of the device.

To provide devices having different threshold voltage logic levels or other characteristics the slit width or carrier concentration can be different. For uniform operating characteristics, the widths should be uniform.

Figure 22:
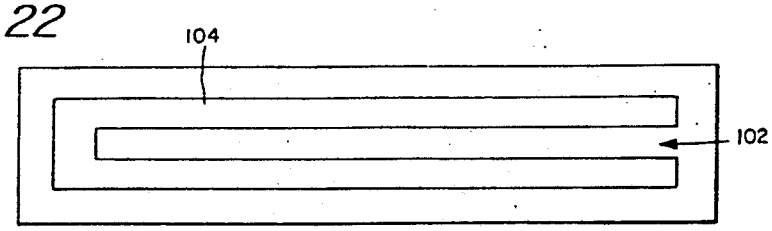
FIG. 22 is a plan view of the metal base of a single transistor module.

A module including a single transistor device, that device having a single slit 102 in a metal base layer 104, is shown in FIG. 22. This device may have particular application to traveling wave amplification of a microwave signal. As before, the single slit 102 has a width in the order of the emitter depletion width. The length of the slit should be several wavelengths. The outer regions of the semiconductor would be proton bombarded as before.

The transistor device embodying the present invention has particular applicability to stacked transistor configurations. For example, the NOR logic gate of FIG. 23, which has three transistors 106, 108 and 110, can be fabricated as shown in FIG. 24. As shown in that figure, the devices are formed in two layers. The emitter contact of transistor 110, for example, also serves as the collector contact of transistor 106. Each transistor is controlled by its own permeable metal base. Because transistor 110 is used as a saturating load or current source which is on at zero bias and has a high output impedance, it will have a different structure from transistors 106 and 108. The openings of the metal can be the same size but the metal should be thicker and the carrier concentration higher. Connections may be made from other gates through internal leads or from outside of the crystal in a manner such as that shown in FIG. 17.

Figure 25:
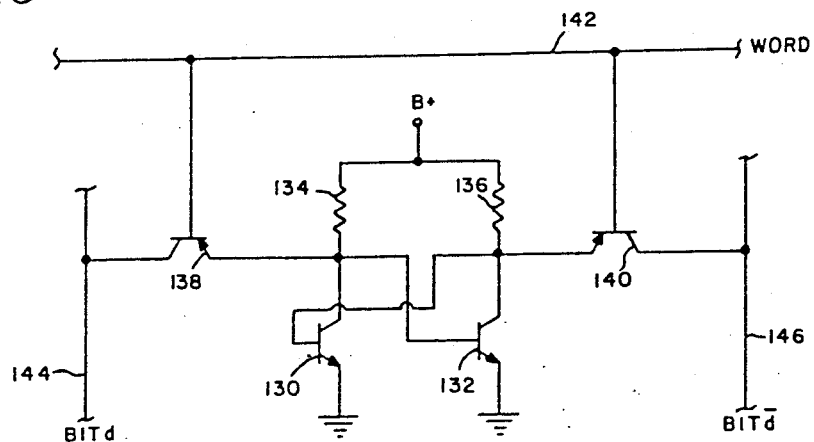
FIG. 25 is a circuit diagram of a conventional memory cell in a static random access memory.

FIG. 25 is a circuit diagram of a conventional memory cell for a static random access memory. The circuit includes a flip-flop circuit formed of two transistors 130 and 132 and load devices 134 and 136. Information can be read into and out of the flip-flop by transistors 138 and 140 addressed by word line 142 and bit lines 144 and 146.

Figure 26:
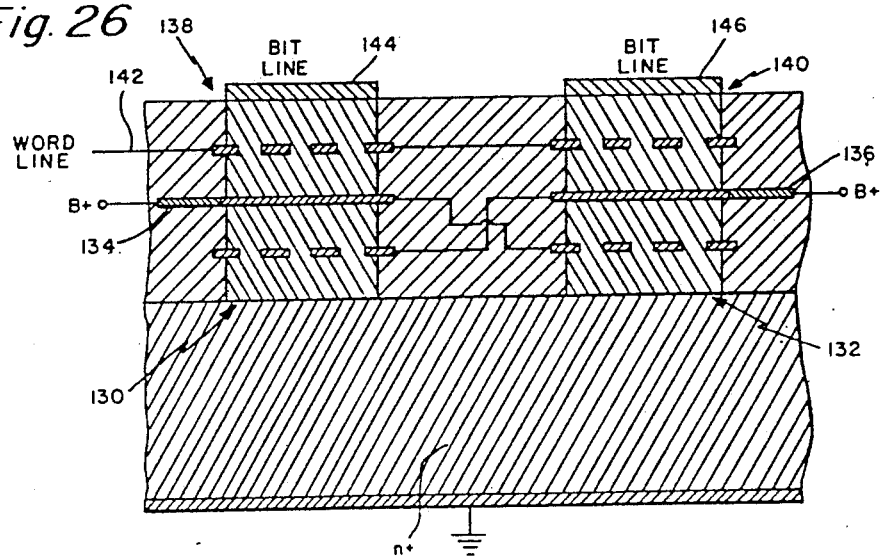
FIG. 26 is a stacked PBT configuration implementing the circuit of FIG. 25.

The circuit of FIG. 25 is readily implemented by the stacked permeable base transistor configuration shown in FIG. 26. In that cross section, connecting leads which would be buried behind or in front of the devices shown are indicated by narrow connecting lines. The load elements 134 and 136 may be high resistance metals embedded in the semiconductor crystal or they may be stacked elements such as shown in FIG. 24 but located in separate stacks in the circuit.

Figure 27:
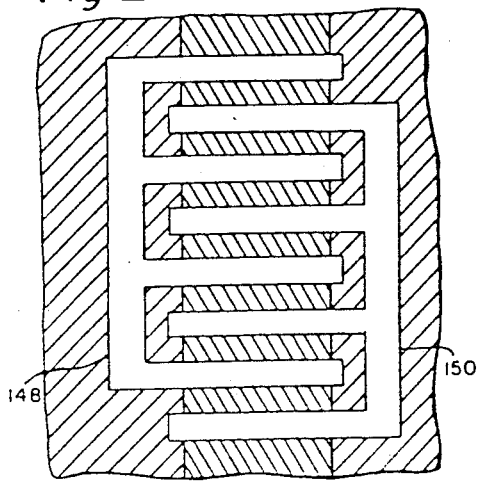
FIG. 27 is a plan view of the metal base of a permeable base transistor having two sets of interleaved base fingers to provide a logic circuit, mixer or gain control amplifier.

FIG. 27 shows the base layer of a permeable base transistor having two sets of interleaved fingers in the base layer, each set being connected to a separate input. By proper design of the transistor dimensions and by connection of appropriate signals to the two base inputs, this device can serve as an AND or an OR logic gate, as a frequency mixer, or as a gain control amplifier.

To use the circuit of FIG. 27 as a logic gate, binary logic signals are applied to each base input. By properly controlling the finger and space widths and the carrier concentration, an AND or an OR gate can be made. For fixed optimum finger and space widths, the device will change from an OR to an AND gate as the carrier concentration in the base region is decreased. For an optimum carrier concentration and fixed grating period the device will change from an OR gate to an AND gate as the finger width increases. The transistor device could be connected in a stacked configuration with an appropriate load device as discussed above.

In communication circuits, it is common practice to apply two signals of given frequencies to a mixer, or modulator, to produce an output signal of a third frequency. One input is said to modulate the output due to the other to provide the output frequency. By applying signals having respective frequencies $f_1$ and $f_2$ to respective sets of base fingers 148 and 150 and with appropriate filtering at the collector terminal, a mixed signal having a frequency of the form $nf_1 \pm mf_2$ can be extracted, where n and m are integers.

The device of FIG. 27 can also be used as a gain control amplifier. An AC signal applied to one set of base fingers is amplified by a factor determined by the signal on the other set of base fingers. Thus, a DC signal can be applied to the other set and by varying that DC signal the gain to the AC signal can be adjusted.

The stacked transistor configurations reduce the surface area of semiconductor chips along with the concomitant surface effects. Such configurations are made feasible by the metal base layer for each device. A patterned metal layer can serve as base regions, collector ohmic contacts, emitter ohmic contacts and interconnecting leads, all of which are embedded in a single crystal. There is no need for a semiconductor base region to be connected at the crystal surface. Rather, a metal base layer continues as an interconnecting lead completely inside the crystal. Areas of the metal which serve as ohmic contacts can be coated with a thin layer of silicon, germanium, sulfur, selenium or other doping element which will diffuse into the GaAs during film growth and consequently form the ohmic contact.

Figure 28:
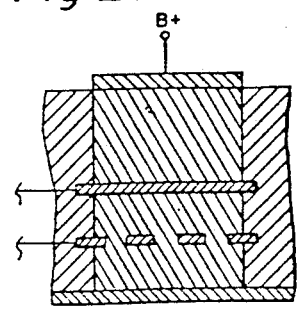
FIG. 28 is a section of a stacked logic element having a current saturated or negative resistance load.
Figure 29:
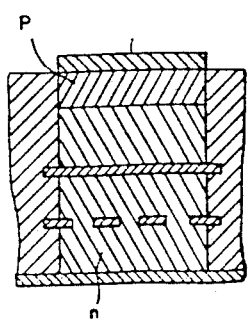
FIG. 29 is a section of a stacked logic device having a negative resistance load.

FIGS. 28 and 29 show other load devices which may be used in a stacked configuration. In FIG. 28, an n-type saturated resistance current limiting device is formed over the PBT. In FIG. 29 a negative resistance device is formed by a pn tunnel junction positioned over the PBT.

Figure 30:
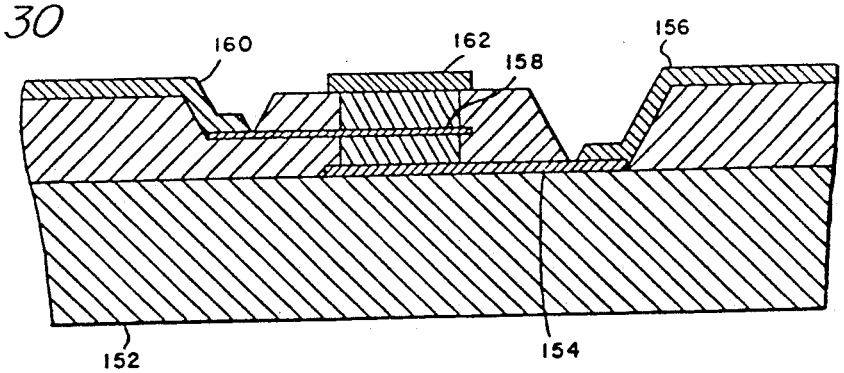
FIG. 30 is a single transistor device formed on a semi-insulating substrate.

As shown in FIG. 30, the device need not be supported on a conducting substrate. In FIG. 30, a device is formed on a semi-insulating substrate 152. An emitter or collector grate 154 is formed on that substrate and may be connected to a contact 156. The base grate is embedded in the crystal formed over the emitter or collector grate and is connected to a base contact 160. Finally, a collector or emitter contact 162 contacts the upper surface of the device.

Figure 23:
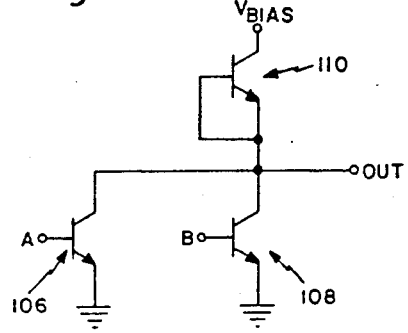
FIG. 23 is an electrical schematic diagram of a NOR gate which may be implemented by the present invention.
Figure 24:
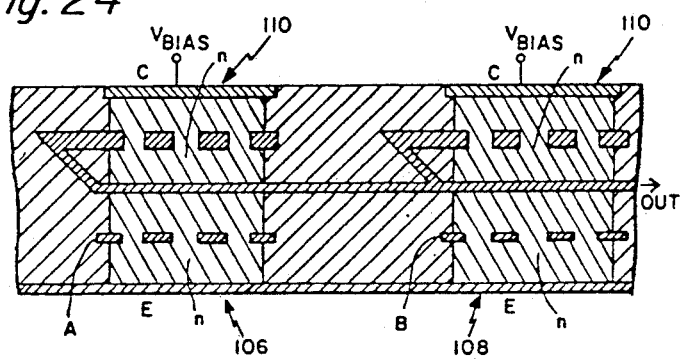
FIG. 24 is a cross sectional view of a semiconductor module implementing the logic circuit of FIG. 23.
Figure 31:
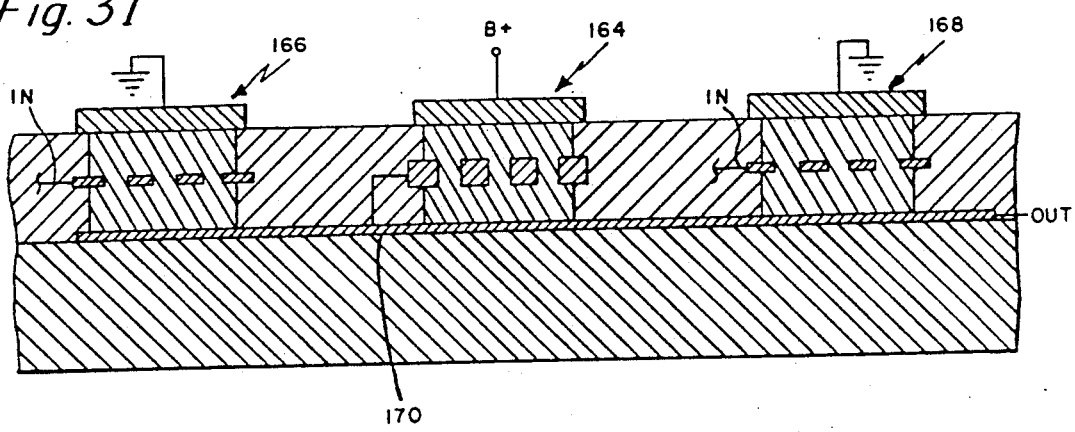
FIG. 31 is an implementation of the OR gate of FIG. 23 on a semi-insulating substrate.

FIG. 31 shows a NOR gate such as that shown in FIG. 23 formed on a semi-insulating gallium arsenide substrate. In that module, a load device 164 is positioned between two PBT's 166 and 168. An embedded grate 170 serves as the common collector to the two PBT's.

In order to produce high quality semiconductor devices of the type just described, the metal base layer should be embedded in a single crystal semiconductor material. Although faults will exist in any crystal, the single crystal should be substantially fault free. To that end, various methods may be used.

Figure 11B:
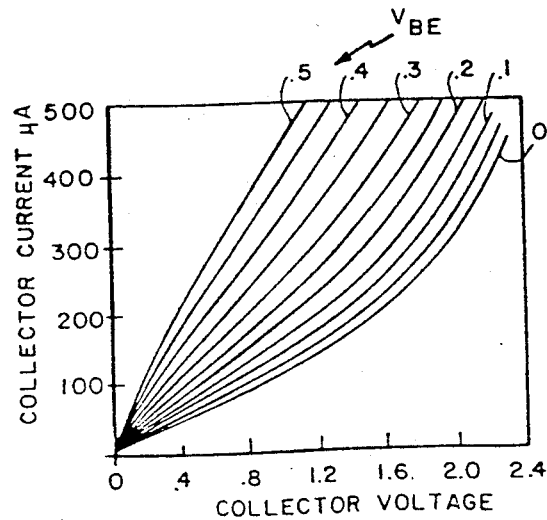
Figure 11C:
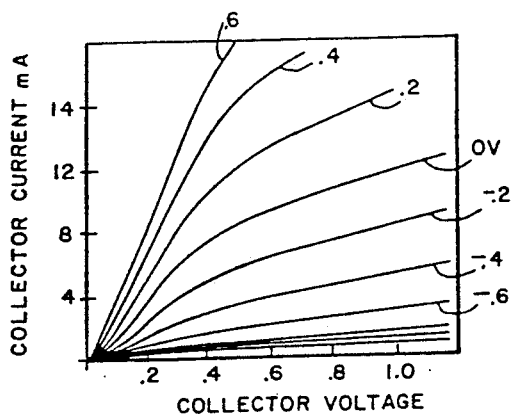
Figure 32:
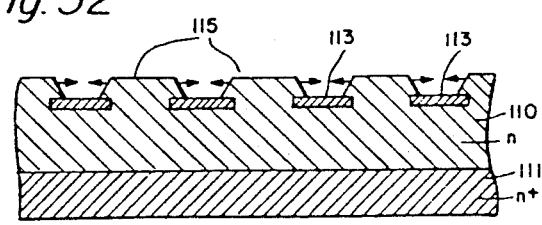
FIG. 32 is a cross sectional view of a module with a single crystal region being grown epitaxially over the metal base layer.

The method of FIG. 32 was used to fabricate the device whose characteristics are indicated in FIG. 11. For the device of FIGS. 11A–B, a single crystal wafer of gallium arsenide is doped n-type with silicon to $1 \times 10^{18}$ cm$^3$. The wafer is then used as an n+substrate 111 which is placed in a AsCl$_3$-Ga-H$_2$ vapor phase epitaxial crystal growth system. A layer 112 of gallium arsenide doped n-type with sulfer to about $1 \times 10^{16}$/cm$^3$, is grown 1.5 $\mu$m thick. Other techniques such as liquid phase epitaxy, molecular beam epitaxy or metal organic epitaxy could also be used to form the gallium arsenide layer. Other dopants for the n-type could be used such as selenium, silicon germanium and tellurium.

A sputtered layer of tungsten is then deposited on the gallium arsenide to a thickness of 250 Å. This layer has a sheet resistance of approximately 25$\Omega$/square. A 900 Å thick layer of photoresist is then applied and exposed with laser holography to form, after development, a 3200 Å period grating pattern having a line width and spacing of approximately 1600 Å each. Using the photoresist as a mask, the tungsten is etched in a CF$_4$ plasma to form a tungsten grating pattern 113 having similar dimensions to the photoresist pattern.

There are a number of other techniques for generating metal gratings on gallium arsenide. Metals other than tungsten which could be used include aluminum, molybdenum, tantalum, zirconium, osmium, iridium, ruthenium and others. The metal can be deposited by evaporation, molecular beam epitaxy, sputtering, or vapor phase deposition. The grating pattern can be defined by holography, X-ray lithography, electron beam lithography or combinations of these. The metal pattern can be formed by lift-off, etching, shadowing or a combination of these. The optimum device would utilize a single crystal metal base layer with low resistance.

Figure 33:
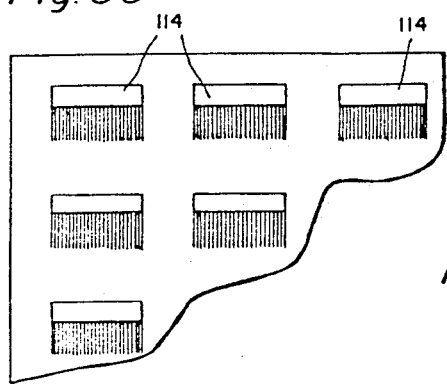
FIG. 33 is a plan view of a metal base pattern used in the method of FIG. 32.

Again using photoresist as a mask, the tungsten grating is etched away in most areas of the wafer except for an array of rectangular patches 30 × 50 $\mu$m. Using photoresist lift-off techniques a 10 μm wide and 50 μm long shorting bar 114 is formed along one edge of each patch to short together the grating lines in the patch. This results in a tungsten pattern as shown in FIG. 33. The pattern includes several thousand patches each with 150 fingers. The fingers are each approximately 1600 Å wide and 20 μm long with 1600 Å spaces between them.

The wafer is then placed back into the epitaxial crystal growth system to form a layer 115 of gallium arsenide over the tungsten grating by the method shown in FIG. 32. The grating lines are purposely oriented on the crystal such that the crystal growth rate is large in the direction indicated by the arrows in FIG. 32 and somewhat smaller in the verticle direction. Thus, the single crystal grows laterally over the tungsten strips at a faster rate than it grows vertically. Specifically, the tungsten may be deposited on a crystal surface which is within three degrees of being perpendicular to the (100) direction, a slow growth direction. The tungsten strips are aligned 10° off the (110) direction. The result is a lateral growth at a rate of about two times higher than the vertical growth rate. The tungsten shorting bar is made large enough so that, despite the high lateral growth rate, some of the tungsten still shows through a hole in the gallium arsenide overlayer after growth is completed.

Once again all of the available growth techniques could be used for covering the tungsten grating with a layer of gallium arsenide, including vapor phase epitaxy, molecular beam epitaxy, and liquid phase epitaxy.

The layer which is grown over the grating has a carrier concentration of $1 \times 10^{16}$ and a thickness of 1.5 μm and is once again doped with sulfur. Other dopants could be used, such as selenium, silicon or germanium.

From the above description of the fabrication method, several points should become evident. First, the crystal and base metal should be relatively nonreactive with each other, even at the crystal growth temperatures, so that the amount of contaminating compounds formed between the two materials is small relative to the amount of the original materials. Also, the metal should be relatively nonreactive to the chemistry of the growth process. Further, the growth process should be such that there is no appreciable amount of nucleation and growth of the crystal directly on the metal base. Such would result in a polycrystalline layer above the metal base and would adversely affect the performance of the device.

The next step in the fabrication is the formation of a gold plated ohmic emitter contact to the back of the n+ substrate. The collector contacts are applied to each device separately on the front side of the wafer using alloyed gold germanium. A collector contact is a 6×40 μm rectangle located above the finger area of the tungsten comb.

The collector contacts are then plated to a thickness of 2.5 μm to provide a proton bombardment mask. The bombardment schedule is $1 \times 10^{13}$ per cm$^2$ at 400 KeV. The bombardment serves to make the GaAs an insulator around the collector and emitter regions of the device and produces a vertical geometry, which maintains a vertical current flow as shown in FIGS. 16 and 17. The device fabrication is brought to completion by sputtering a layer of titanium over the entire surface followed by a layer of gold and another layer of titanium. 50 μm×70 μm gold pads are then plated using photoresist as a mask. The pads are arranged in pairs and are aligned to contact the collector ohmic contact and the tungsten shorting pad respectively. The Ti-Au-Ti layer is then etched away everywhere outside the bonding pad area. The bonding pads lie then mostly on gallium arsenide which has been made insulating by proton bombardment.

The method of FIG. 32 was also used to fabricate a second device whose electric characteristics are given in FIG. 11C. However, for this device the tungsten gratings were made in a different way. As before a gallium arsenide n+ substrate was used, and an n-type layer having a concentration of $1 \times 10^{16}$/cm$^3$ was grown uniformly over the surface. This surface was then coated with polymethylmethacrylate (PMMA), a known X-ray sensitive resist. An X-ray mask composed of 3200 Å period grating having equal lines and space was fabricated according to the scheme described by Flanders and Smith, *J. Vac. Sci. Technol.* 15(3), May--June, 1978, pp. 995 and 1001.

Figure 34A:
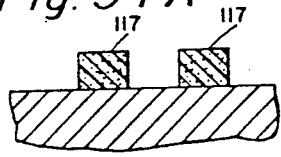
FIG. 34A-C illustrates several steps in forming a metal base grid in another method of fabricating a PBT.
Figure 34B:
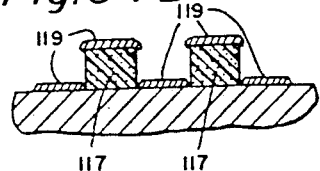
Figure 34C:
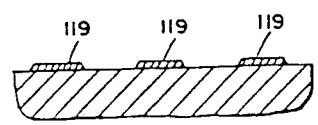

The X-ray mask was placed in contact with the sample using an electrostatic field and placed in a vacuum system with an X-ray source. This structure was then illuminated with $C_K$ (48.8 Å) X-rays from a direction perpendicular to the surface. The vacuum and mask were then removed from the sample and the PMMA image was developed resulting in the PMMA structure 117 of FIG. 34A. 300 Å of tungsten 119 was then deposited on this structure as in FIG. 34B. The PMMA was dissolved, leaving the tungsten grating on GaAs in FIG. 34C. The process just described is commonly known as the lift-off process.

Figure 35:
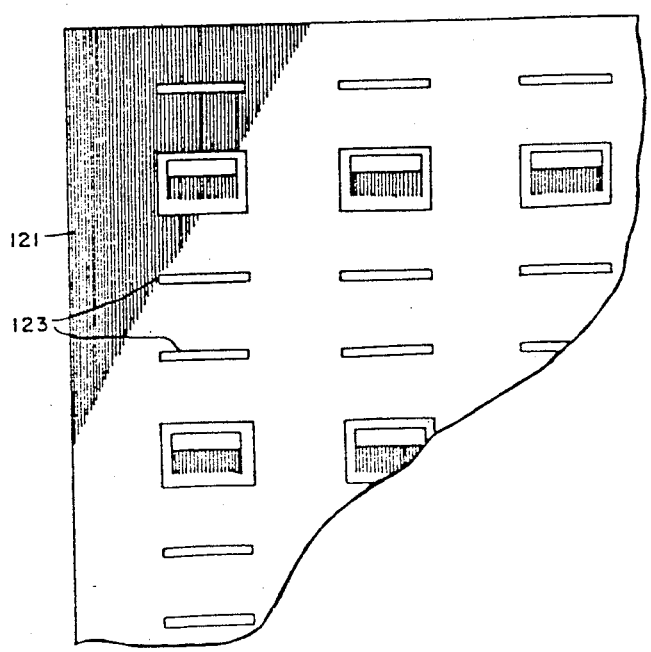
FIG. 35 is a plan view of the metal base and metal isolation pattern used in the method of FIG. 32.

Once the tungsten gratings are in place on the gallium arsenide the comb pattern was formed as before to provide the base regions for the transistors as shown in FIG. 35. The combs in this case are surrounded on the surface by tungsten gratings 121 with small breaks 123 between devices in a column. The grating aids in crystal growth by providing a uniform environment. The wafer was placed in the epitaxial reactor as described earlier. All of the succeeding steps were the same as those described earlier.

Figure 36:
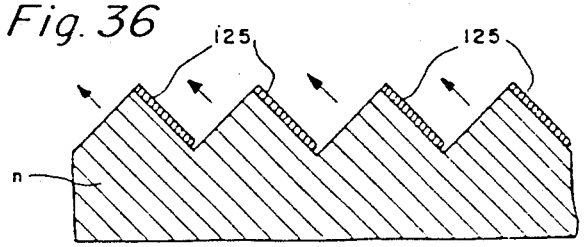
FIG. 36 is a cross sectional view of a module during fabrication in which the crystal lattice is preferentially etched to assist in formation of a metal base grid.

In the method illustrated by FIG. 36, etching of the metal base layer is not required to provide the strips. Rather, the underlying crystal is formed with a striated surface and the metal 125 is deposited selectively in accordance with the orientation of the surface. Then, the underlying single crystal is grown over the metal strips as in the method of FIG. 32.

The relief structure of the crystal can be formed by any known preferential etch. This preferential etch will tend to produce a structure with fewer irregularities than the photo resist grating. The metal is deposited with a directed deposition process such as E-beam evaporation or ion beam sputtering. The period of the relief structure can be controlled with great precision. The plane angles can be measured after etching and the direction of deposition can be modified accordingly. As a result, the transverse dimensions of the metal pattern can be controlled with a greater precision than could otherwise be obtained.

As shown in FIG. 37, the metal layer 127 can be shadow deposited at the apex of and on each side of each ridge of the striated surface. The resulting base structure offers several advantages. It provides a much lower base resistance than could otherwise be obtained in a flat metallic grating. It also allows convenient control of the width of the semiconductor openings by means of controlling the angle at which the directed deposition is made. Thus, better control from sample to sample is provided.

The method of FIG. 38 is particularly suitable for embedding the metal base layer within a single crystal where there is a tendency for the metal and crystal to react during the epitaxial growth technique. For example, where silicon is the crystal material, silicides are easily formed with the base metal at epitaxial growth temperatures. In accordance with the method of FIG. 38, the strips 116 are formed on a single crystal substrate 118 as before by etching of a continuous metal layer. Then, an amorphous or polycrystalline silicon layer 120 is deposited over the metal strips and the single crystal layer 118. This layer is then scanned by a laser in the direction indicated by the arrow. The laser forms a molten or nearly molten zone 122 which scans across the substrate and results in the recrystallization of the silicon layer 120 to epitaxially form a single crystal. The laser recrystallization occurs quickly enough to minimize the reaction between the metal and silicon thereby minimizing the formation of silicide.

In the method of FIG. 39, grooves are etched into the semiconductor crystal. Then metal 129 is deposited in those grooves to form the base layer fingers. The thick central regions of the fingers provide a low base resistance while the tapered edges along the slits in the resultant base layer keep the transconductance of the device high. With the base region pointing toward the collector, the device has the same advantages as that of FIG. 37.

Note that, in each of the above methods, each opening in the base layer advantageously provides a starting surface for the growth of single crystal semiconductor material over the layer. Thus an upper region can be grown over a base layer to virtually any controlled thickness. A wide range of crystal orientations are also possible. The method thus has benefits beyond that of providing the active device of the invention. As will be discussed below, it may also be used to grow the crystal over wide connecting leads, ohmic contacts and isolating Schottky barriers. Openings are formed in such leads and the like to facilitate crystal growth from the lower region to them. Of course, the embedded leads and the like need not be totally embedded. Wide, continuous portions are left exposed for external connections.

In previous methods of embedding metal base layers in semiconductor crystal such as shown in U.S. Pat. Nos. 3,322,581; 3,372,069; 3,425,879, the minimum thickness of crystalline overgrowth was dependent on establishing a lateral growth rate much higher than the growth rate of epitaxial thickness. Even though the lateral rate of growth can be quite high in some crystallographic directions there are limits and the requirement of a specific direction of orientation places restraints on the technology, making it less flexible and thereby limiting its usefulness. This can be stated by the following equation:

$$T_{min} = G_V \left( \frac{w}{G_W} \right)$$

where $T_{min}$ is the minimum thickness of single crystal material which can be formed of the amorphous material. $G_V$ is the vertical or thickness growth rate and $(w/G_W)_{max}$ is the maximum ratio between the lateral growth dimensions w of the area to be overgrown and the growth rate $G_W$ in the direction of W.

With the present method layers of arbitrarily small thickness can be grown over crystalline or amorphous films if only the crystalline or amorphous layer is perforated or slotted. The overgrowth tends to be smoother and more uniform if the perforations or slots are uniform in size and opening and are periodic in spacing.

Slits are actually preferred to other types of perforations such as circles or squares. Crystal facets always form along slow growth planes when growing from openings and lateral growth rate $G_w$ is fast until the crystal growth reaches one of those facets. Slits can be oriented slightly off any of the many slow growth planes such that the growth from the center region of the slit is fast. As a result, the facets form first at the ends of the slit and, because of the angles of the facets from the slits, the growth from the center of the slit is at first not interrupted. Where the slits are periodically spaced side-by-side the fast crystal growths from the center of two slits meet before they reach slow growth facets. In contrast, fast growth from a short hole would quickly reach end facets, and for fast growth from two holes to meet the holes would have to be very close together. Thus, with slits reasonably spaced, one can obtain fast lateral growth to form a thin, smooth layer.

This technique using perforations does not require large lateral growth rates, and therefore in certain cases it will eliminate the need for special crystallographic orientations. In fact in some cases it may be desirable to orient the crystal so that the lateral growth rate is of the same order as the thickness growth rate. This requirement may come about because it is often the case for semiconductors that the rate of incorporation of impurities varies with growth rate. Smooth, thin layers of the single crystal layers are still possible even though lateral growth rate is low if the openings or slots are placed close together, and the concentration of impurities in these growth layers are likely to be more uniform since the growth rates are more equal in all directions.

Another advantage of the perforated technique is that it provides greater flexibility when used for an integrated circuit. If, for example, some areas of the metal film over the gallium arsenide are left continuous while other areas are perforated or slotted, openings in the overgrown single crystal layer can be created. The openings expose the underlying metal film wherever the lateral growth rate is too low to cover over the film.

Another example of this crystal embedding technology begins with a grating formed uniformly over a surface of a gallium arsenide wafer. The grating might be removed in some areas. The remaining tungsten may then serve as a base or ohmic contact region for a PBT or an interconnecting conductor. On some of the remaining tungsten grating areas thin film patches of $SiO_2$ may be formed. The $SiO_2$ patches are specially sized and arranged on the wafer so that crystal overgrows completely except in the area of the $SiO_2$. The $SiO_2$ which is exposed through the openings in the overgrown layer can be removed to expose the underlying tungsten grating. Contact can then be made to the tungsten grating by applying another grating on the freshly grown surface across and down into the opening and on the freshly grown surface. If new $SiO_2$ patches are applied in appropriate areas, the wafer can then be overgrown as before, and the regions which were not overgrown before because of the protecting $SiO_2$ now have gallium arsenide exposed and therefore quickly fill with gallium arsenide. The interconnect is now buried in the gallium arsenide crystal. This sequence can then be continued for enough layers to form an entire integrated circuit. With the selective use of proton bombardment, one can then isolate the active devices by creating insulating regions of gallium arsenide around the interconnects.

Use of the above-described method of fabricating integrated circuits by selectively embedding of metal in the semiconductor crystal will now be described with respect to specific examples.

Figure 42:
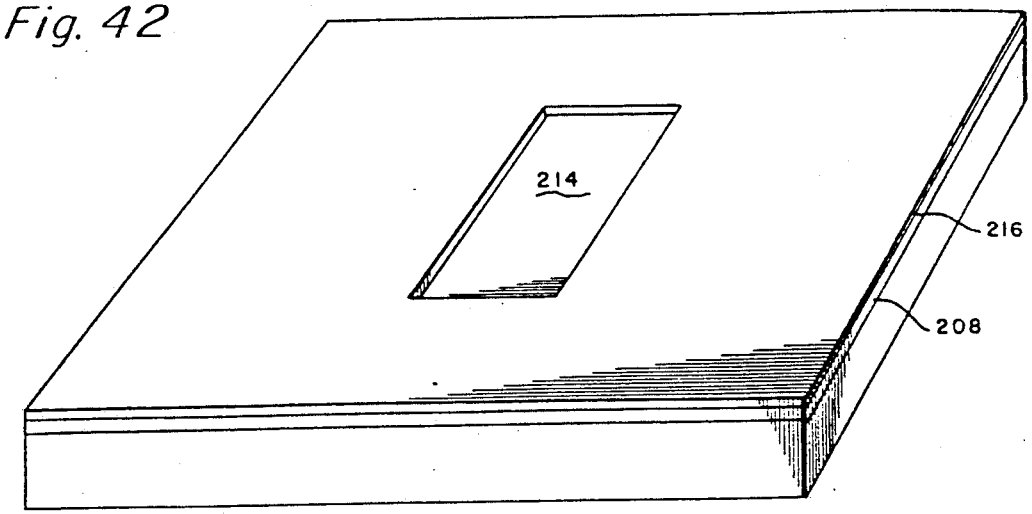
FIG. 42 illustrates another step in the fabrication of the circuit of FIG. 40 in which the noncontinuous regions of the metal pattern are overgrown with semiconductor crystal.

FIG. 40 shows two inverters in series in a direct coupled logic circuit. It includes two transistors 200 and 202 and two load resistors 204 and 206. The circuit can be fabricated by the method illustrated in FIGS. 41–46. The first layer of gallium arsenide crystal 208 of FIG. 41 n type epitaxial is already in place on an n+ silicon doped gallium arsenide substrate. The tungsten pattern is then formed on the surface of the gallium arsenide as shown in FIG. 41. The fingers 210 on the left come from somewhere else on the integrated circuit and serve as the input and the base of permeable base transistor 200. The second set of fingers 212 to the right form the base of the second permeable base transistor and are connected to a large contact pad 214. The contact pad is designed so that during the epitaxial growth step which follows the pad is not overgrown with gallium arsenide. The overgrowth over the pad is minimized if the pad is large relative to the lateral growth rate from the edges of the pad. The fingers, however, are narrow enough so that they are overgrown. The result of epitaxial growth of the second layer 216 from the first is shown in FIG. 42. The tungsten pad 214 is exposed through the openings in the gallium arsenide epitaxial layer. The two epitaxial layers 208 and 216 have a doping concentration which provides the proper operating characteristics for the PBT's. The tungsten 214 exposed through the opening is slotted as in FIG. 43 using a mask and a tungsten etch. The original epitaxial layer 208 shows through the tungsten slots.

Figure 43:
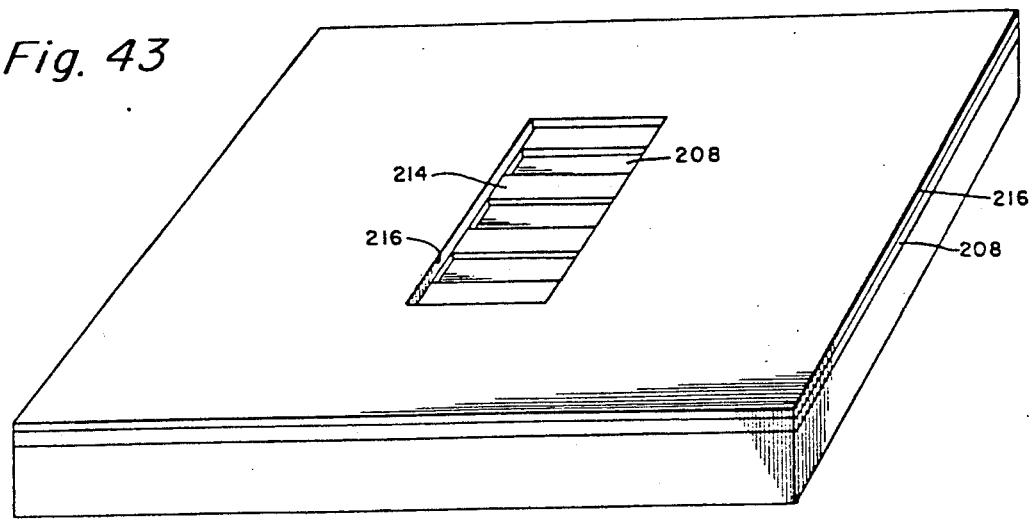
FIG. 43 illustrates the next fabrication step in which the exposed metal pad is etched to provide slots.
Figure 44:
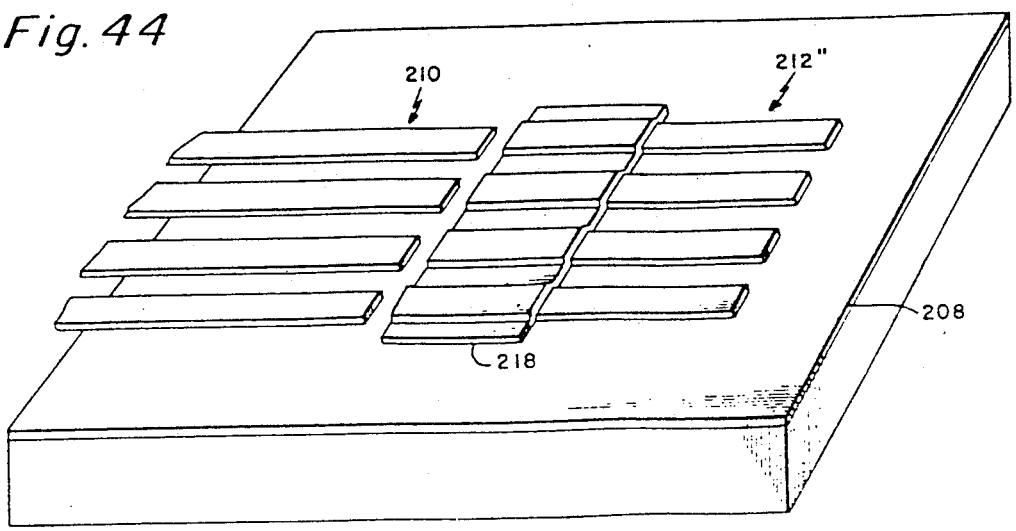
FIG. 44 illustrates an alternative means for preventing overgrowth of a region of the metal pattern.

An alternative method for forming the slotted tungsten of FIG. 43 is partly illustrated in FIG. 44. The tungsten fingers are extended into the contact area. Then a pad 218 of silicon dioxide or some other material different from tungsten or gallium arsenide is applied over the fingers. The pad 218 prevents overgrowth in that region during growth of the second layer 216. The slots through the tungsten down to the gallium arsenide can be formed by simply removing the silicon dioxide. In a third method of forming the slotted tungsten of FIG. 43, the tungsten fingers are extended into the contact area and they are completely overgrown with gallium arsenide. Next, a preferential etch which attacks gallium arsenide but not tungsten is used to etch down to expose the tungsten grating in the contact area.

Figure 45:
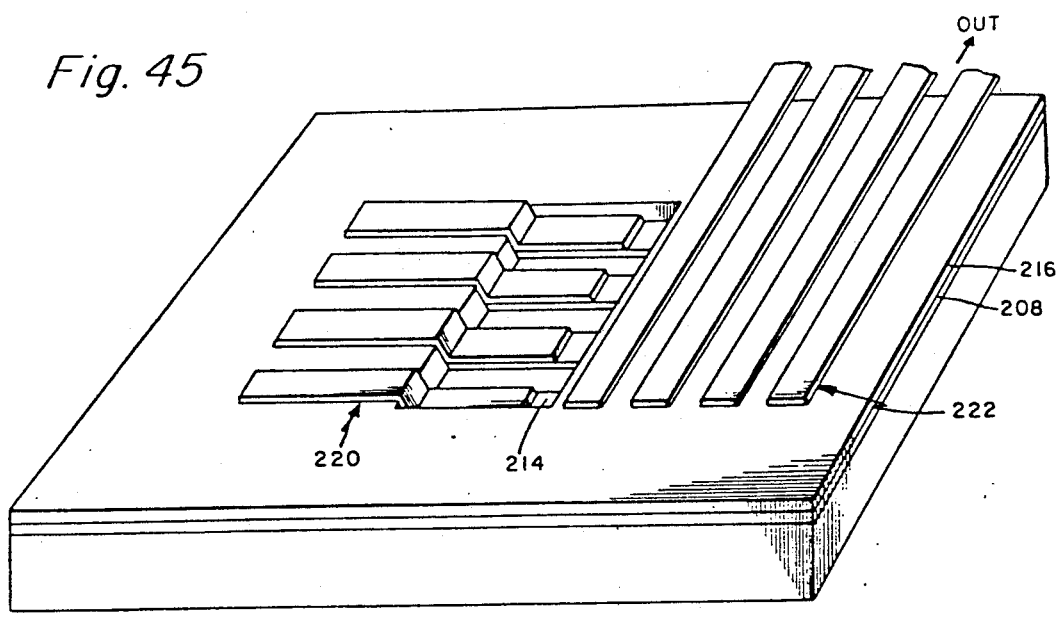
FIG. 45 illustrates a subsequent fabrication step in which collector contacts and an interconnection to the lower metal pattern are made.
Figure 46:
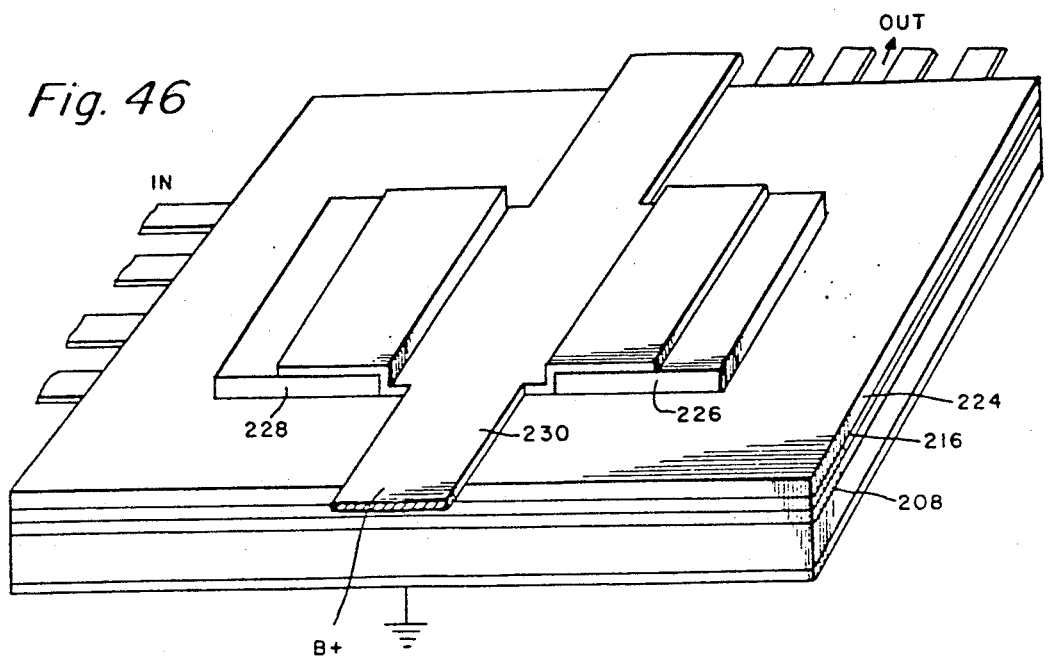
FIG. 46 illustrates the final fabrication steps in which upper contact pads and a connecting bus are provided.

In the next step a second tungsten pattern is formed as shown in FIG. 45. The fingers 220 interconnect to the tungsten layer below and also form the collector contact. The tungsten fingers 222 form the collector of the second transistor and lead away to some other part of the integrated circuit. This layer must not be simply tungsten because it must form an ohmic contact to the gallium arsenide. It may be deposited so that it contains some other element such as silicon or germanium or it may be a multi-layered structure of tungsten and some other element.

Another epitaxial layer 224 is grown to completely cover all of the previous tungsten. The slots formed in the pad 114 allow the gallium arsenide to grow up through that area. The growth rate in depressions in the crystal is larger than the growth rate on flat surfaces; thus, when growth is complete the surface may have a flat, smooth appearance. The advantage of the smooth top surface is that additional logic circuit wires or leads or another layer or logic may be added on top of the filled region without complications of shorting and without passing over steps. This last epitaxial layer 224 has a carrier concentration which is appropriate to provide a resistor, a saturable resistor or a negative resistor as the load to the inverter gates. The collector contact pads 226 and 228 are applied and they provide proton bombardment masks to finish the transistor structure. The proton bombardment provides insulating gallium arsenide surrounding the interconnects. Finally, interconnecting lead 230 is formed.

Figure 47:
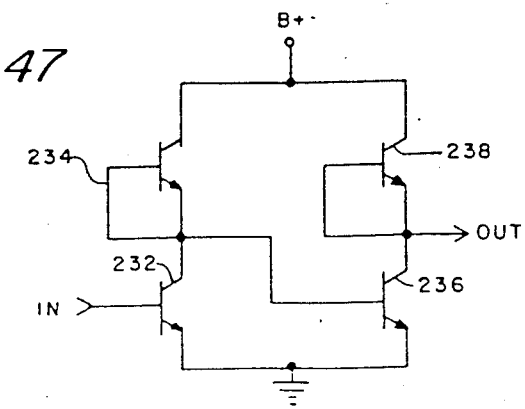
FIG. 47 is a circuit diagram of a circuit similar to FIG. 40 except that the resistive loads are replaced with transistor devices.
Figure 48:
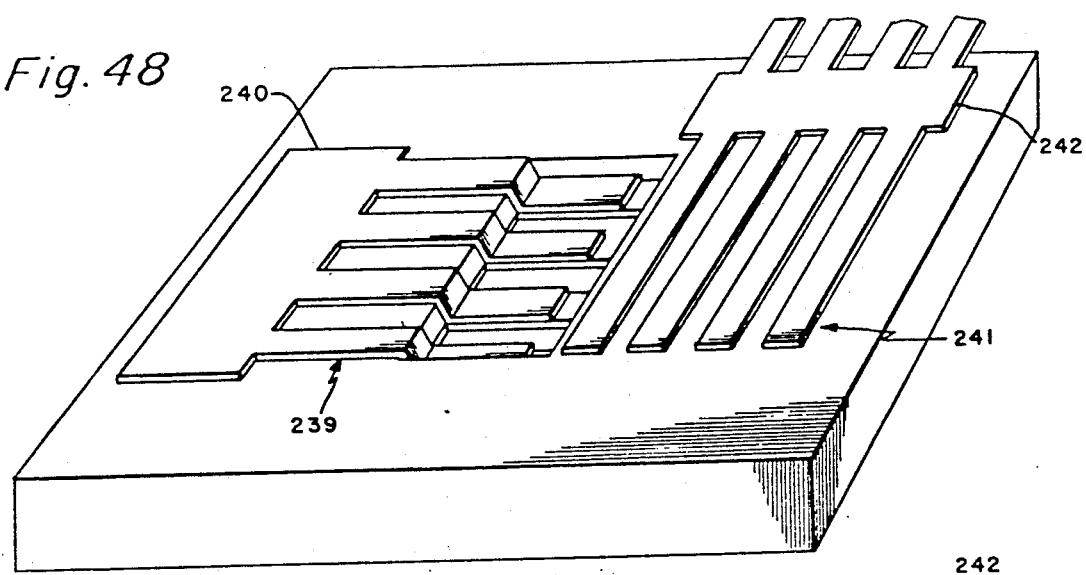
FIG. 48 illustrates the formation of collector contacts for the circuit in FIG. 47.

A second example of circuits which could be constructed using crystal embedded circuits is shown in FIG. 47. In this circuit two pairs of stacked transistors 232, 234 and 236, 238 are involved. The top transistors 234 and 238 act as saturated loads. The construction of this circuit would be the same as the previous one through FIG. 43. Then the process would continue as in FIG. 48.

Figure 49:
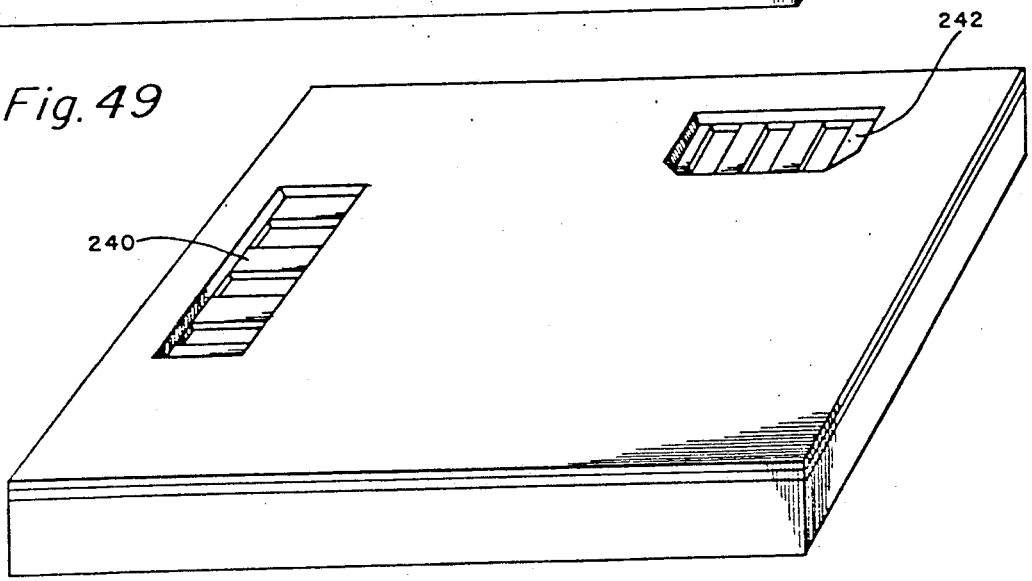
FIG. 49 illustrates the next fabrication steps in which the collectors are overgrown with semiconductor and slots are etched into the exposed contact pads.
Figure 50:
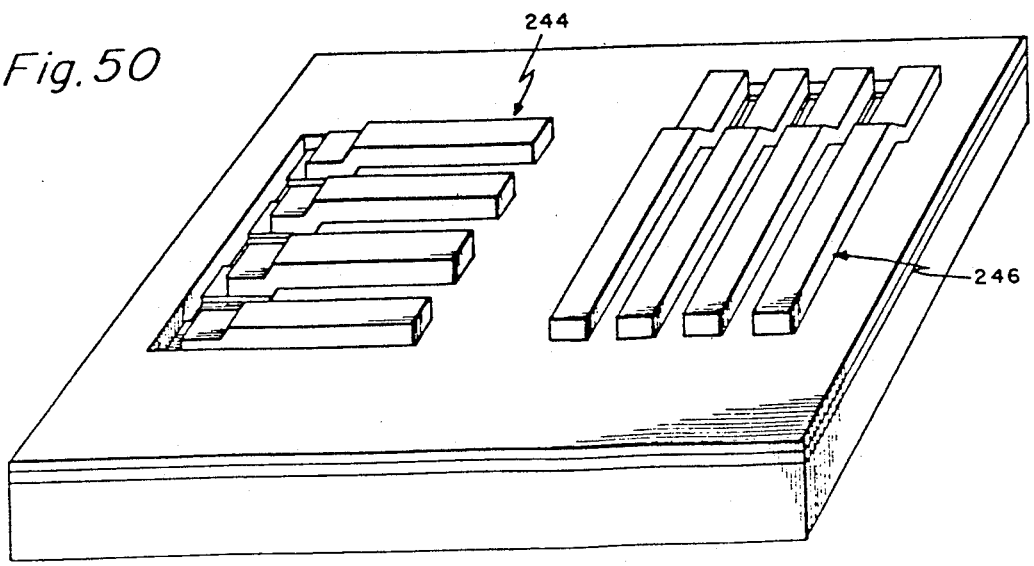
FIG. 50 illustrates yet another fabrication step for the circuit of FIG. 47 in which the base layers of the load transistors are applied.

The collector contacts 239 and 241 of the lower transistors 232 and 236 now have large pads 240 and 242 attached to the tungsten ohmic contact fingers. In the next step a level and smooth overgrowth is made everywhere except over the pads. Then, the slots are once again etched as in FIG. 49. The base layers 244 and 246 with interconnects are applied as in FIG. 50. Here the tungsten metal layer provides a Schottky barrier instead of an ohmic contact. Finally, but not shown, the final epitaxial layer is grown, and the collector contacts are applied. Once again the contacts provide the proton bombardment mask. The collector contacts can now be connected together and to the B+ supply bus as before.

Many other circuits could be conceived using these fabrication techniques and other devices not shown could be constructed in the circuit including resistors, diodes, capacitors and inductors.

Several features of the above technique can be summarized as follows:

1. Areas of tungsten which are narrow, perforated or slotted are covered during gallium arsenide epitaxy if the spacing between perforations is small enough relative to the film thickness desired. The size of the spacing required is also a function of crystal orientation.

2. If some areas of tungsten are perforated or slotted and some are not, the unperforated areas may not grow over and may then provide holes in the gallium arsenide layer for interconnects.

3. After the interconnects are made the holes and interconnects can be completely grown over with single crystal gallium arsenide if the perforations are formed in the previously unperforated areas.

4. Metal wires and connections between wires can be embedded inside a single crystal. The two wires which form the connection can be in the same plane or in two different planes.

The logic inverter gates of FIGS. 40 and 47 use what is commonly referred to as direct coupled logic. Direct coupled logic utilizes a very simple circuit and is commonly used in NMOS and PMOS technology, but it does not work well with biopolar devices. Direct coupled circuits made with bipolar transistors suffer from current hogging where one of several transistors driven from the same drive transistor turns on first and consumes so much current that the other transistors do not turn on. The PBT does not have the current hogging problem because of the Schottky barrier in the base.

There is another type of circuit which could also be used for PBT logic gates—the complementary logic or complementary PBT (CPBT). This type of circuit is similar to the circuits commonly referred to as CMOS, and if the supply voltage is held to 0.1 to 0.2 volts below the Schottky barrier height, these circuits have the advantage of lower power dissipation, as little as 1/100 of the power dissipation as the circuits of FIGS. 40 and 47. Two types of transistors are required, one with a base Schottky barrier to n-type semiconductor and the other with a base Schottky barrier to p-type semiconductor. The bias polarities and internal electric fields are reversed in the p-type device because the base metal forms a Schottky barrier to p-type material. The current carriers are now holes instead of electrons, and the fixed charge in FIG. 3 is negative instead of positive.

Figure 51:
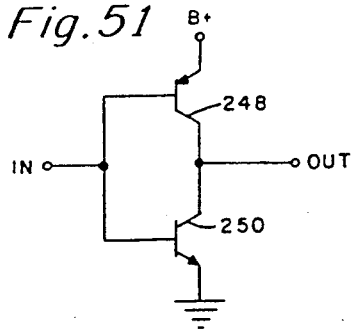
FIG. 51 is a circuit diagram of an inverter using complementary transistor devices.
Figure 52:
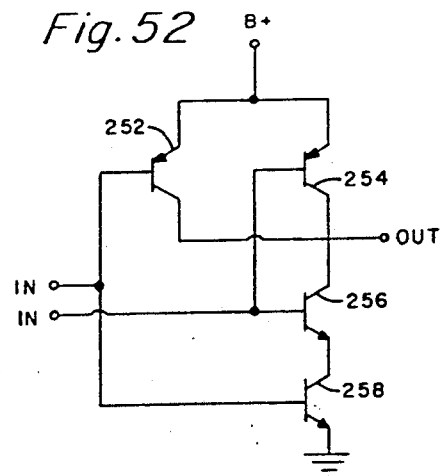
FIG. 52 is a circuit of a NAND gate using complementary devices.
Figure 53:
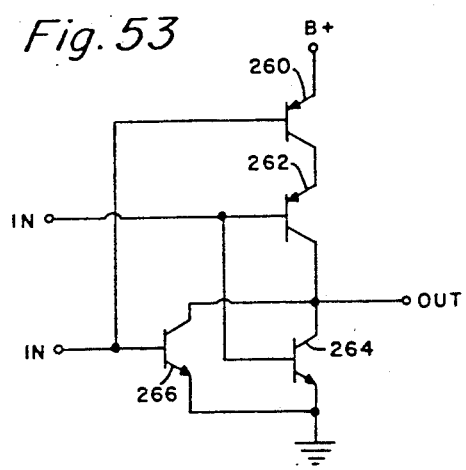
FIG. 53 is a circuit diagram of a NOR gate using complementary devices.

An inverter and NAND and NOR gates for CPBT circuits are shown in FIGS. 51, 52 and 53. A greater number of different gallium arsenide and tungsten layers are required to fabricate the CPBT structure when compared to the previous structures. This occurs because complementary transistors are required and because there are more transistors in the logic gate circuits. The cross-sectional views of chips having each of the circuits of FIGS. 51, 52 and 53 are given in FIGS. 54, 55 and 56, respectively.

Figure 54:
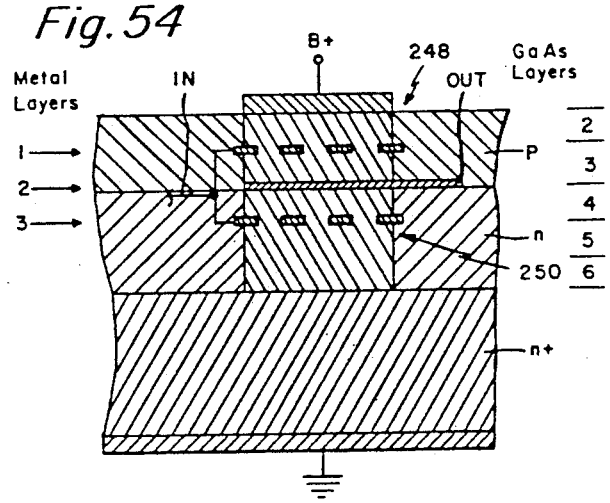
FIG. 54 is a cross sectional view of a complementary permeable base transistor circuit for the inverter of FIG. 51.

In FIG. 54, the transistor 250 is formed in the n-type crystal over the n+ substrate. A p-type crystal is grown over the n-type crystal and the base metal of the transistor 248 is embedded in that crystal.

Figure 55:
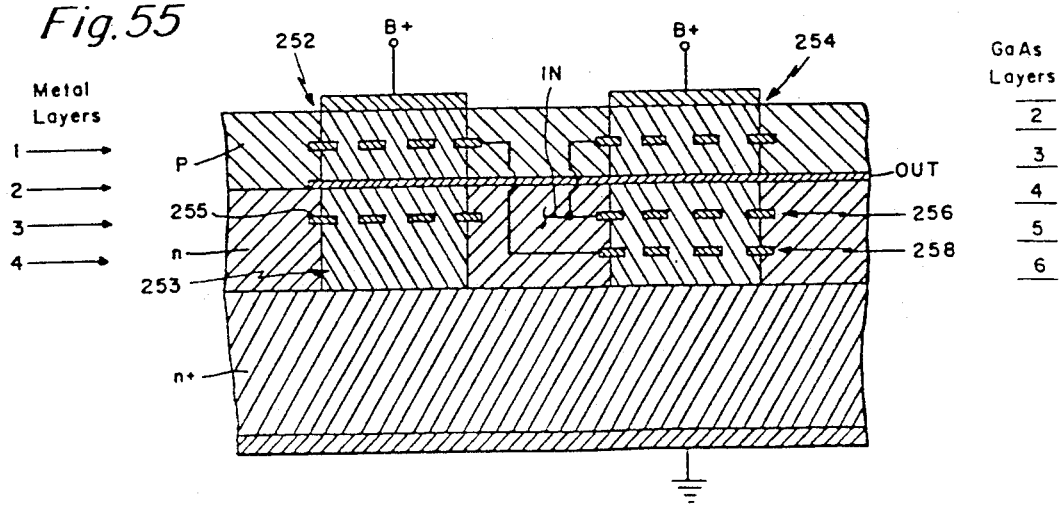
FIG. 55 is a cross sectional view of a CPBT circuit for the NAND gate of FIG. 52.

In FIG. 55, the two transistors 256 and 258 are formed by sandwiching the two base layers between three n-type layers of semiconductor crystal. This is possible because the emitter of the transistor 256 and the collector of transistor 258 are in common. The same semiconductor layer is used for the common emitter and collector and no central ohmic contact is required. The two p-type transistors 252 and 254 are formed in separate stacks with transistor 254 positioned over the n-type transistors. This leaves an unused transistor block 253. That block would act as a short circuit but for an embedded nonsemiconductor layer 255 which may alternately be an insulator or Schottky barrier 255. The barrier 255 is embedded using the technique of this invention but the slots in the layer need not be the same as those necessary for a PBT. Rather, smaller slots provide for better isolation.

Figure 56:
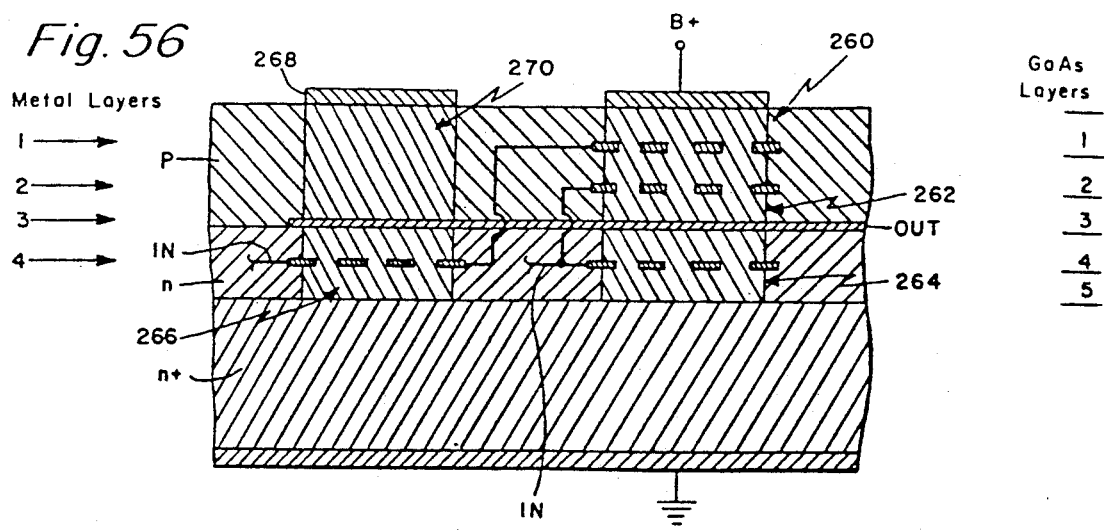
FIG. 56 is a cross sectional view of a CPBT circuit for the NOR gate of FIG. 53.

FIG. 56 shows the NOR gate of FIG. 53. Transistors 260 and 262 are provided in a three layer p-type stack over the n-type transistor 264. N-type transistor 266 is provided in a separate stack. So long as no connection is made to the upper contact 268, isolation is not necessary in the unused block 270.

Together, the cross-sections in FIGS. 54–56 show six layers of gallium arsenide and five layers of metal. The identically numbered layers have identical electrical properties and could be combined and aligned in the final circuit. The inverter of FIG. 54 has the same layer structure as the NAND gate, and with combinations of these two all of the logic functions can be achieved.

Since p-type gallium arsenide has lower mobilities than n-type, PBTs made with p-type material are slower than n-type devices having the same carrier concentration and dimensions. Also, when stacking two devices such as 256 and 258, transistor 258 is in the emitter circuit of transistor 256 and this increases its emitter resistance. This causes the stacked pair to be slower than a single transistor. Considering both of the above factors in choosing between NAND and NOR gates, the optimum choice for speed is the NAND gate configuration of FIGS. 52 and 55. The n-type transistors are stacked to more nearly match the slower speed of the p-type transistors. This avoids the stacked p-type transistors of FIGS. 53 and 56, the slowest combination. On the other hand, NAND/inverter logic requires complicated circuits, and fewer inverters would be required if the NAND and NOR gates could be used together in one integrated circuit. This could be accomplished with six layers of gallium arsenide as labeled in FIGS. 55 and 56 and five interleaving metal layers. Six metal layers are required if a semi-insulating substrate is used. In some types of integrated circuits this could result in a considerable space savings.

Figure 57:
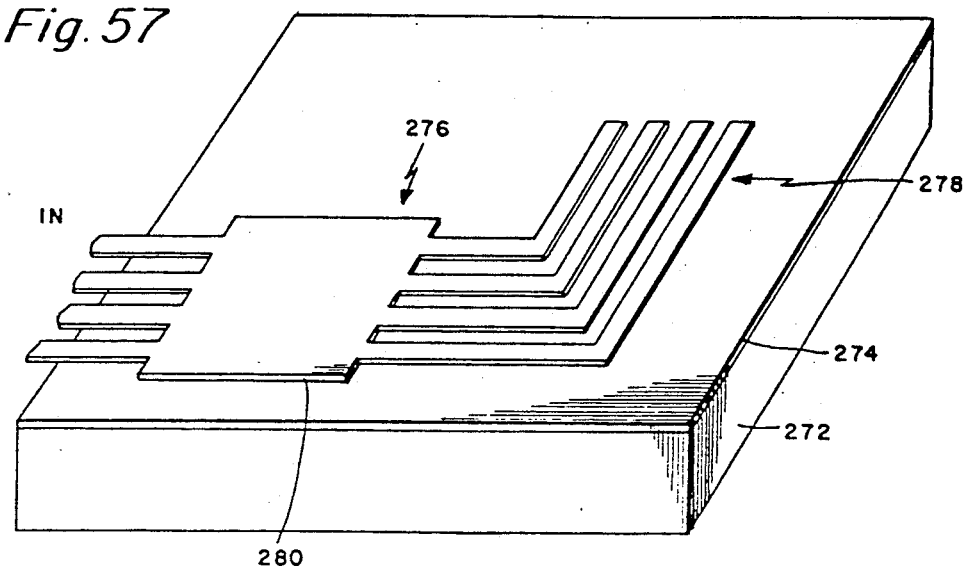
FIG. 57 illustrates a first step in the fabrication of the NAND gate of FIG. 55.
Figure 58:
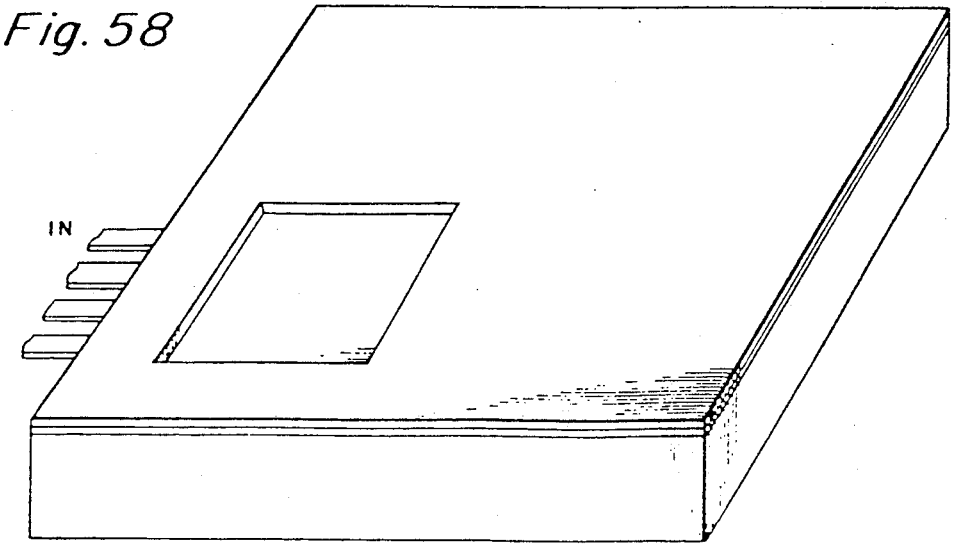
FIG. 58 illustrates the first overgrowth of semiconductor crystal in fabrication of the gate of FIG. 55.
Figure 59:
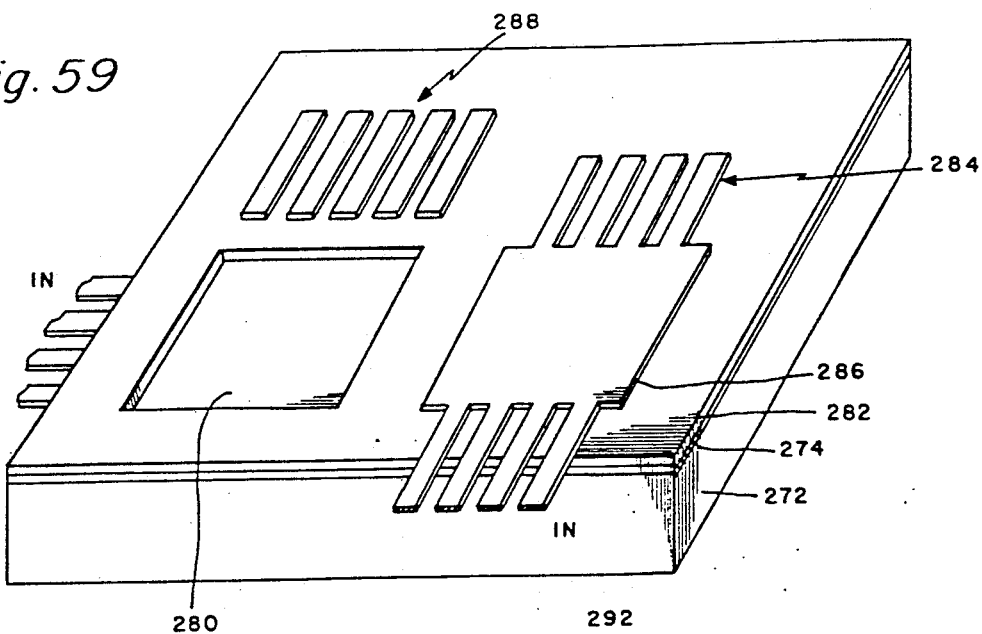
FIG. 59 illustrates a subsequent fabrication step in which a Schottky isolation layer and a PBT base layer are formed.
Figure 60:
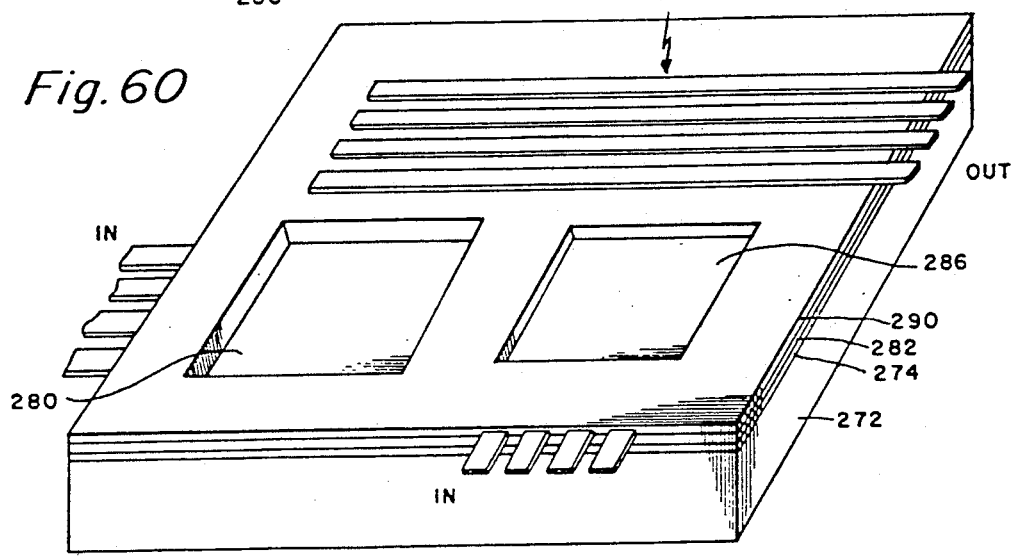
FIG. 60 is an illustration of a subsequent fabrication step in which a collector contact is formed.
Figure 61:
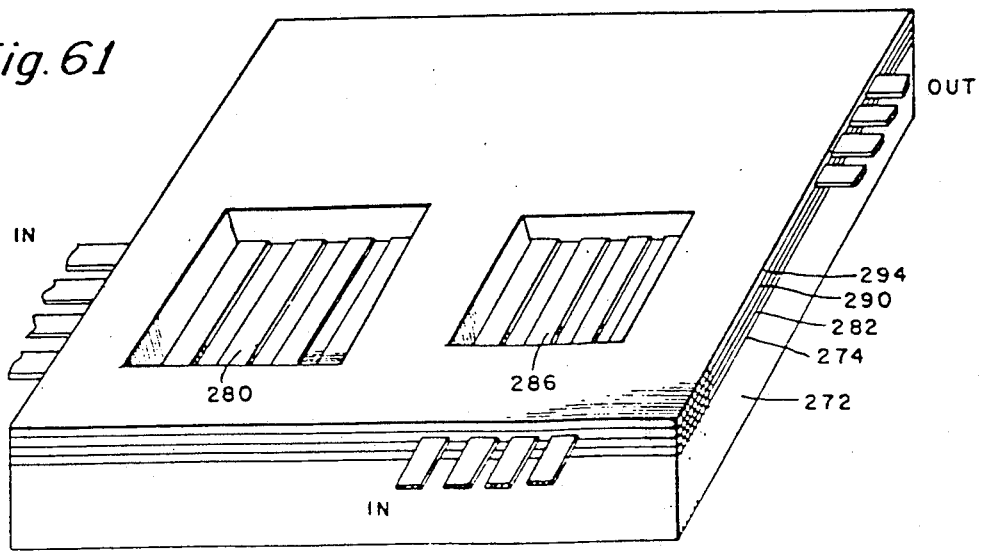
FIG. 61 is an illustration of a subsequent step in which slots are etched into connecting pads left exposed through the overlying crystal.
Figure 62:
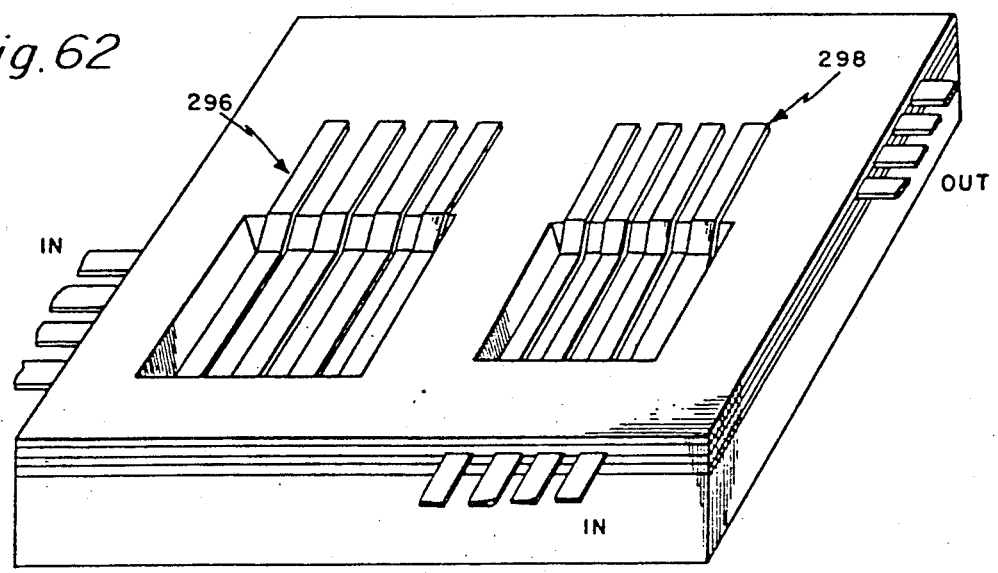
FIG. 62 illustrates yet another fabrication step in which base layers are formed in the p-type crystal.
Figure 63:
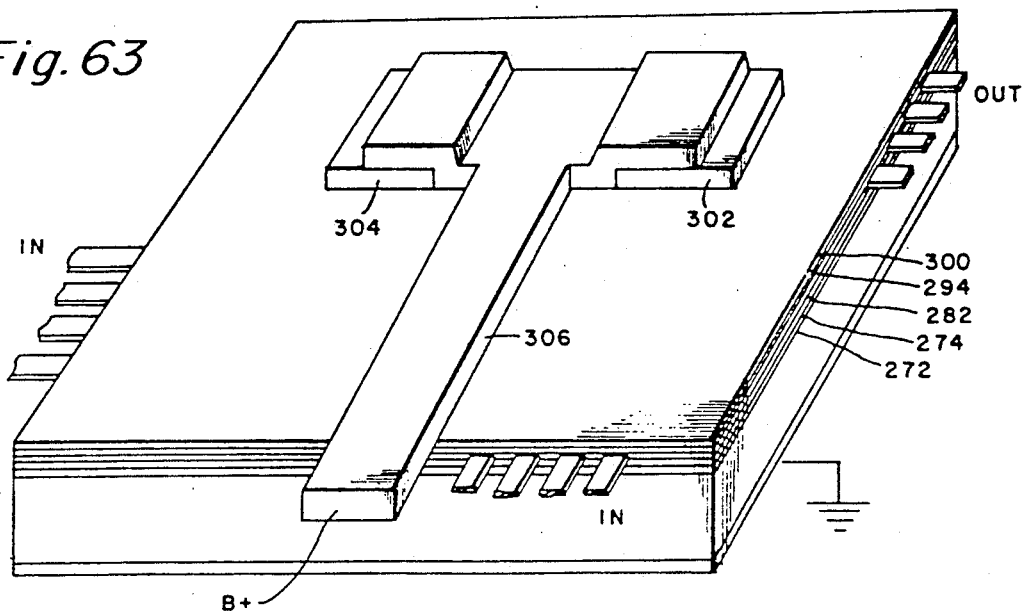
FIG. 63 illustrates the final fabrication steps in which upper contact pads and a connecting bus are formed.

A fabrication sequence for the NAND gate will now be given with reference to FIGS. 57–63. The fabrication begins with an n+ gallium arsenide substrate 272 with an n-type epitaxial layer 274 already grown. The n-layer has a carrier concentration appropriate for the grate spacing which will be used in the metal layers which follow. In FIG. 57 a tungsten metal pattern 276 is applied to the gallium arsenide layer 274 and forms an input from another region of the integrated circuit and a Schottky barrier for the base region 278 of the PBT 258. The large area pad 280 provides the interconnect between layers in subsequent steps. Arrangements could be used for the interconnects such as shown in FIGS. 41–50. The grate regions are then overgrown with single crystal gallium arsenide layers 282 shown in FIG. 58. The gallium arsenide is n-type and of the appropriate concentration for the PBTs. The tungsten pad 280 does not grow over and shows through the opening. In FIG. 59 tungsten is applied for the base region 284 of PBT 256, for the input pad 286 from another region of the integrated circuit and for the isolation region 288. An n-type layer 290, whose concentration is appropriate to finish out PBT 256, is then grown, as in FIG. 60. The tungsten pattern 292 is applied for the collector contacts to PBTs 252, 256 and 258 and for output to another region of the integrated circuit. In order to make ohmic contact to the n-type material beneath the tungsten an ultra thin layer of germanium may be applied before the tungsten is applied. As a result, during the high temperatures of epitaxial growth an ohmic contact forms. The collector contact 292 is overgrown with p-type gallium arsenide layer 294 as shown in FIG. 61. The layer makes ohmic contact with the collector and has a carrier concentration appropriate for PBTs 252 and 254. Although the holes in the gallium arsenide caused by the interconnect pads 280 and 286 shrink in size during each overgrowth step the holes remain open so that tungsten shows through. The tungsten in the holes is then perforated to expose the single crystal gallium arsenide below. In FIG. 62 the base tungsten regions 296 and 298 are applied for PBTs 252 and 254 with interconnects to the perforated pads 280 and 286. In FIG. 63 the final p-layer 200 is grown and a metal ohmic contact pad 302 for the power supply is placed over the stacked PBTs. A second pad 304 is placed over PBT 252. Both pads also serve as masks for proton bombardment. Finally power supply bus 306 is connected to other parts of the integrated circuit.

In the fabrication process for the CPBT it is desirable to have barrier heights between the metal and semiconductors which are nearly equal for both n and p-type PBTs and which have values which are between 0.5 and 1 volt. In order to achieve this, some special processing may be required to control the interface between the metal and the semiconductor. For example, to increase the barrier between tungsten and p-type gallium arsenide a small amount of indium may be required at the metal semiconductor interface. Another example is to increase the barrier height between tungsten and gallium arsenide with a thin layer of oxide (100 Å) at the metal semiconductor interfaces. The ohmic contacts may also require some special treatment to the interface between metal and gallium arsenide. Metal to p-type contacts may require a p-type dopant such as cadmium, magnesium, zinc, or beryllium at the metal semiconductor interface. Similarly, metal to n-type may require n-type dopants such as germanium at the interface.

Figure 69:
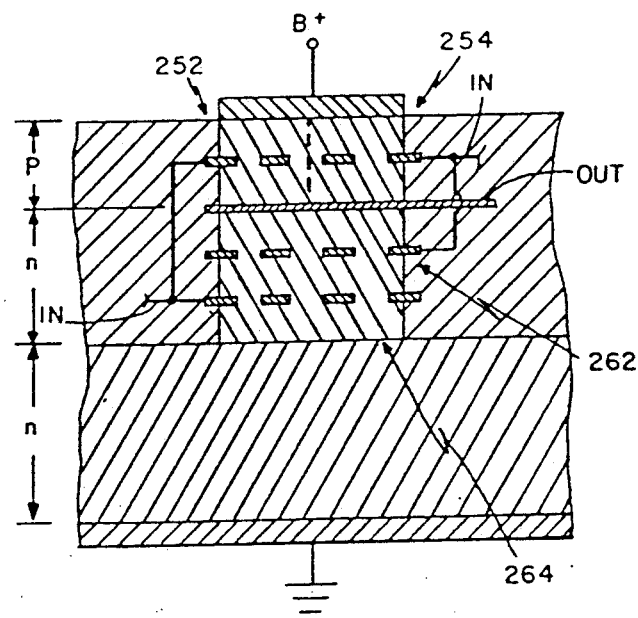
FIG. 69 is a cross-sectional view of another implementation of the circuit of FIG. 52.

It is possible to achieve even higher densities for the NAND gate of FIG. 52. In the device of FIG. 69, transistors 252 and 254 have been combined into one block thereby eliminating one stack. The grate of what was the base of transistor 254 in FIG. 55 is divided in half along the direction of the grating lines so that the left two fingers are connected together to form one input and the right two fingers form another. The dotted line represents an imaginary line dividing the two transistors.

The stacked configuration for the CPBT which has just been described is very compact because of the stacked design. Much of the area consumed by the source and drain contacts of a normal MOSFET structure has been eliminated because the circuit is multi level. However, the PBT logic circuits which have been described can also easily be formed on an insulating substrate to make them more like MOSFET structures. This is accomplished by replacing the n+ substrate with an insulating substrate and placing a metal layer between the substrate and the n-type crystal. The extra metal layer would be an ohmic contact to the emitter of the PBTs. The emitter could also easily be brought out to the top surface similar to the schematic of FIG. 30.

Figure 64:
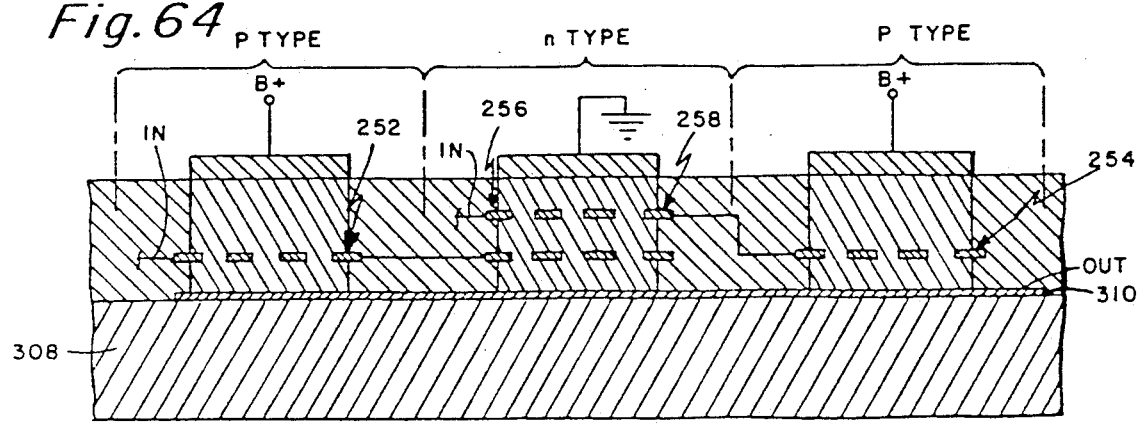
FIG. 64 is a cross sectional view of a CPBT NAND gate as shown in FIG. 52 formed on a semi-insulating substrate and with the p and n-type regions side by side.

Another embodiment for a CPBT is given in FIG. 64. In this case a semi-insulating substrate 308 is used and the collector metallization 310 is applied first. Three n-type layers are then grown with two tungsten base layers therebetween using a process similar to that described above. Ion implantation can then be used to create p-type regions for PBTs 252 and 254. Selective epitaxy could also be used to create the localized p and n-type regions. The advantages of this type of structure include a lower stray capacitance and possibly easier fabrication.

Figure 65:
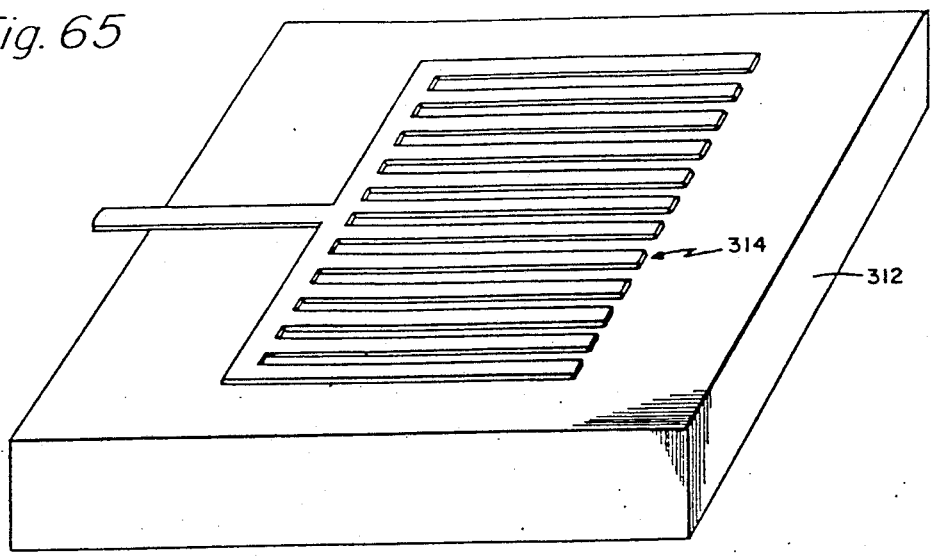
FIGS. 65 and 66 illustrate two steps in the fabrication of a capacitive device using the techniques of this invention.
Figure 66:
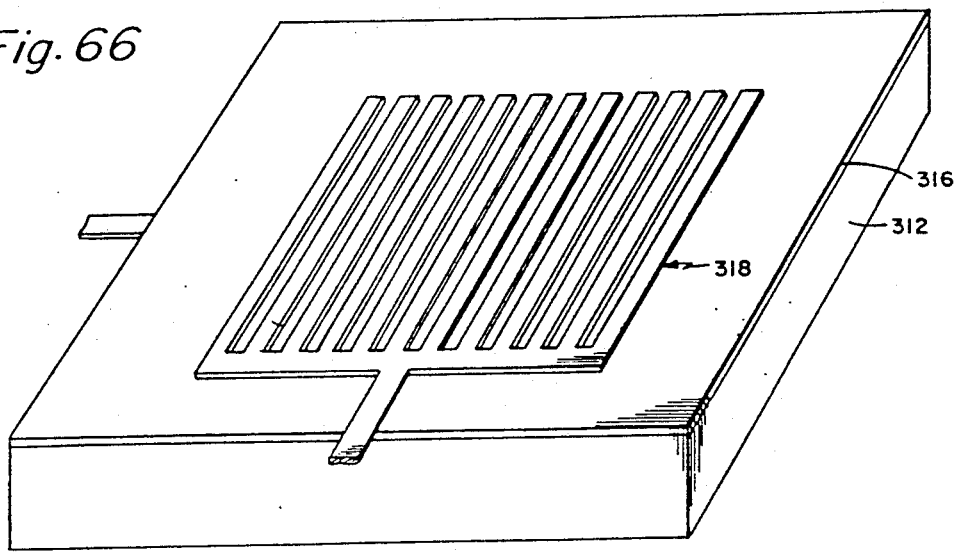

There are obviously other circuit elements which can be constructed. For example, in FIGS. 65 and 66 the fabrication of a capacitor is given. In FIG. 65 tungsten is applied over single crystal GaAs 312 in a fingered pattern 314 as one plate of the capacitor. The fingers are provided as a noncontinuous region to allow overgrowth with a thin layer of gallium arsenide. The first layer is overgrown with gallium arsenide layer 316, and a tungsten fingered pattern 318 is placed as the second plate of the capacitor. GaAs could be grown over the second plate if desired. The capacitor could be made on the same wafer as and in parallel with other parts of the above described integrated circuits. Proton bombardment would make the gallium arsenide between the capacitor into an insulator.

Figure 67:
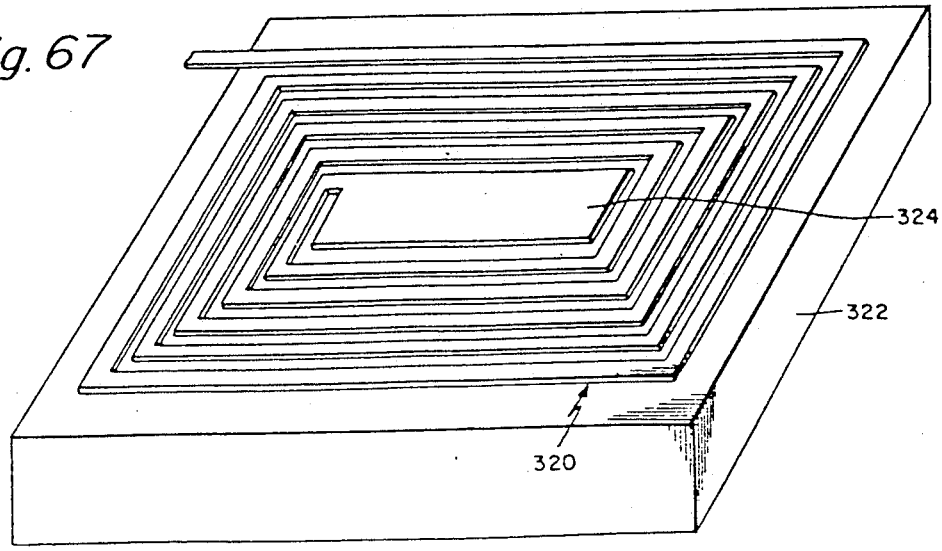
FIGS. 67 and 68 illustrate two steps in the fabrication of an inductive device using the techniques of this invention.
Figure 68:
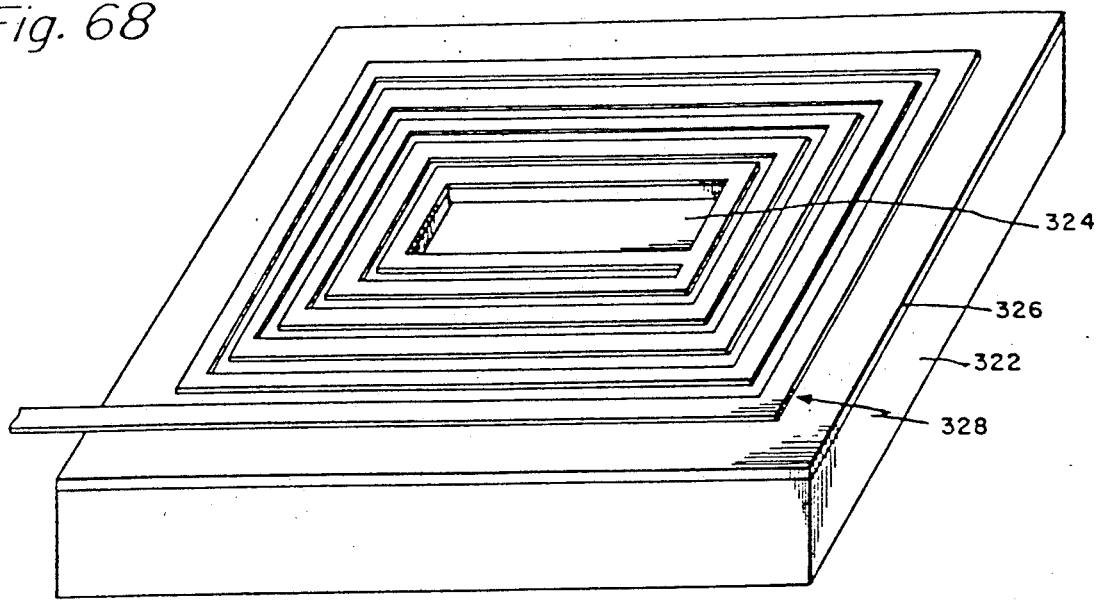

An inductor could be made in FIGS. 67 and 68. In FIG. 67 a coil 320 is made with tungsten on single crystal gallium arsenide substrate 322. An interconnect pad 324 is provided in the center. When the coil is overgrown with gallium arsenide 326 the pad shows through an opening in the center as in FIG. 68. A second coil 328 is then applied in the same direction as the first and connection is made in the center. Once again, protons can make the gallium arsenide insulating and gallium arsenide can be grown over the second coil.

A resistor can easily be made with thin narrow tungsten lines. By adding oxygen or other impurities to the tungsten its resistivity can be raised to greater than 100 ohms per square for layers 300 Å thick. Meander line resistors having resistances of 10,000 Ω can be buried inside of insulating crystals.

Diodes can also be easily incorporated in this technology as is apparent from the structure of the PBT which can be considered as two back-to-back diodes.

Figure 70:
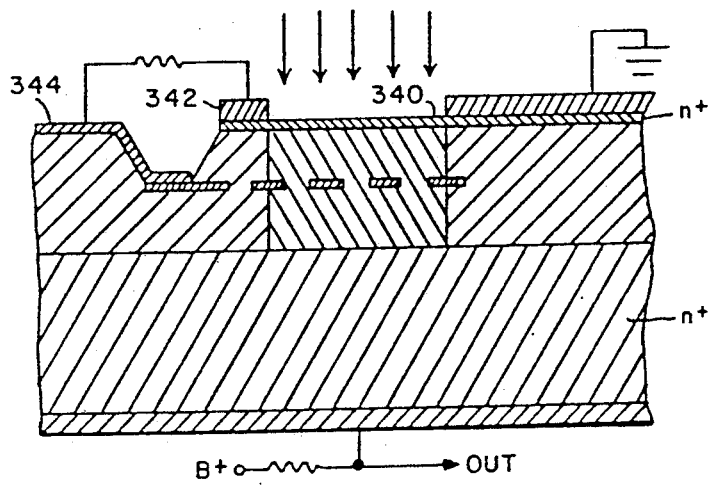
FIG. 70 is a cross-sectional view of a phototransistor.
Figure 71:
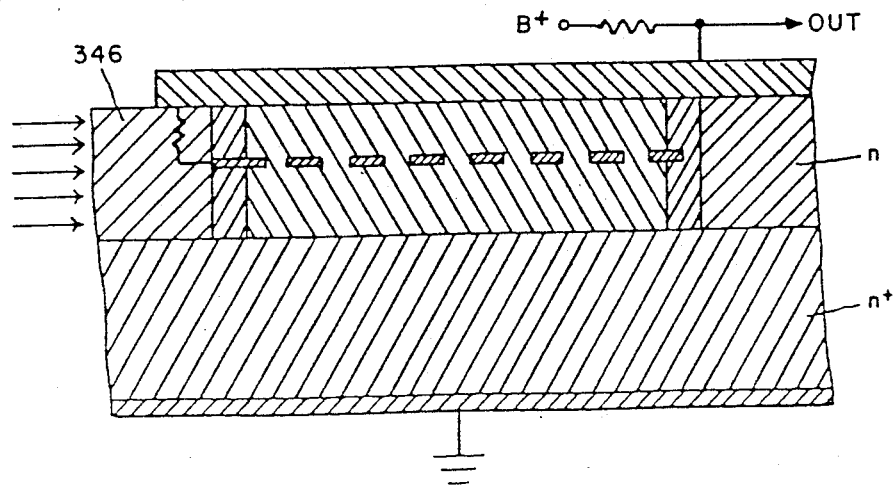
FIG. 71 is a cross-sectional view of a phototransistor at the end of a light guide.

It is possible to make a configuration of the permeable base transistor so that light can enter either the emitter or collector regions or both as shown in FIGS. 70 and 71. Even though the light generates minority carriers, when properly designed the fields in the device will quickly sweep them into the base contact. Such a device allows the light to enter only in regions where there are electric fields which can move the electrons to the base contact. In the case of the n-type PBT, the holes which are swept into the base contact will modulate the base voltage which will in turn modulate the current through the device. The advantage of the optical permeable base transistor is high speed when reasonably high light power is available and high gain at frequencies below 100 MHz.

FIG. 69 shows an n-type PBT having an n+ layer 340 which serves as an emitter contact. Metal contact 342 connects the n+ contact through a load resistor R to the base contact 344. Light enters the emitter region through the thin n+ layer 340. The concentration and the thickness of the emitter layer are designed to allow the electric field from the Schottky barrier depletion region to penetrate to the n+ layer.

In FIG. 71 the PBT has been buried in an optical waveguide and light enters from the left waveguide 346. In this case the light is below the band edge and hole-electron pairs are generated with the Franz Keldis effect by applying a large collector bias.

While the invention has been particularly shown and described with reference to preferred embodiments thereof, it will be understood by those skilled in the art that various changes in form and details may be made therein without departing from the spirit and scope of the invention as defined by the appended claims. For example, the structure described and claimed has particular application to three-contact transistor devices. However, variations in the structure of the active semiconductor device may be made, for example, by adding a screening electrode between the metal base layer and the collector contact. Also, the preferred Tungsten material may be combined with other materials to form the metal layer.

Recently several new methods have been used to fabricate PBT's having very good performance. The key difference between the new and older methods is in the technique for forming the gratings. One of the recent methods which led to a device having 16db gain at 18 GHz was made using an etching procedure for making the tungsten grating. The method begins very similarly to the method described above with respect to FIG. 32. An n type gallium arsenide wafer with an epitaxial layer about $4 \times 10^{16}$/cm is provided. The wafer is then coated with about 300A tungsten using sputtering or vacuum evaporation. The tungsten surface is then coated with silicon dioxide and PMMA, an X-ray sensitive resist. The PMMA image of the grating is then obtained with x-ray lithography as was described earlier. About 400A of nickel is then deposited and lifted using the lift off process. An additional nickel pattern is added over the nickel grating using photoresist lift off. The additional nickel pattern forms the base pads as described earlier except for a minor design change. There are now two base pads, one contacting each end of the base fingers. This nickel on $SiO_2$ on tungsten on GaAs structure is placed in a reactive ion etching machine. Using $CF_4$ or similar gas in the plasma, the nickel etches very slowly and the GaAs somewhat more rapidly whereas the $SiO_2$ and tungsten etch quite rapidly so that the nickel pattern can be transferred into the tungsten film. The etch is very anisotropic so that the walls of the $SiO_2$ and tungsten are vertical and the tungsten pattern has the same dimensions as the nickel pattern. The nickel and $SiO_2$ are then removed. The overgrowth of the tungsten by the GaAs and the device fabrication then proceeds very similarly to what has been described in the previous specifications. One minor addition to the process just described would be to etch away some of the nickel grating lines after the base pads are in place but before reactive ion etching. By removing nickel in the proper places, after reactive ion etching additional tungsten will have been removed to isolate each base region from the surrounding tungsten and from other devices on the wafer.

A second fabrication sequence begins with the same epitaxial wafer, which is coated first with silicon dioxide, then with PMMA. The PMMA is then patterned with gratings as described before followed by the nickel lift. The base regions are made by etching the nickel in some areas and devices can be isolated by adding nickel patterns. The silicon dioxide is then etched in the reactive ion etcher or as described before, producing a pattern in the oxide having vertical sidewalls. The wafer is next etched slightly in a GaAs etch to remove damaged material and it is coated with 300A of electron beam evaporated tungsten. By placing the wafer in hydrofloric acid the $SiO_2$ will dissolve and the metal can be lifted off. With this technique the tungsten grating lies in slight depressions (300A deep) in the gallium arsenide surface because the GaAs was slightly etched during processing. The wafer is now ready for overgrowth and processing into PBT's as described previously.

As a modification of the process just described one can take a wafer having just completed the reactive ion etching of the silicon dioxide and further etch the gallium arsenide. This would be done in an ion beam assisted etching machine using chlorine gas. In this machine, the nickel is the etch mask and the gallium arsenide is etched in a very anisotropic manner. This allows trenches to be etched in the gallium arsenide which can have a depth on the order of 4000A and a width of about 1600A and a grating periodicity of 3200A. This is then coated with tungsten so that there is tungsten in the bottom of the trenches and on the top surface. Using lift off by dissolving the silicon dioxide as described before, only the tungsten at the bottom of the trenches remains. This wafer can now be overgrown as described before. The advantage of this technique is that the gallium arsenide material in the openings between the tungsten lines is from the original epitaxial layer, and may be of higher quality than the overgrown gallium arsenide in the second epitaxial layer.

We claim:

1. A method of embedding a layer of metallic material in a single crystal semiconductor comprising:
   providing a single crystal semiconductor substrate;
   providing a metal layer on the single crystal semiconductor substrate with small, uniformly dimensioned and uniformly spaced openings in a first portion of that metal layer to expose portions of the substrate, openings not being provided in second portions of the metal layer; and
   epitaxially growing single crystal semiconductor from the exposed portions of the substrate through the openings to embed the first portions of the metal layer, the second portions remaining exposed.

2. A method of embedding a layer of material in a single crystal as claimed in claim 1 wherein the layer of material is deposited relative to the crystal orientation to provide a much greater rate of crystal growth laterally across the layer than away from the crystal substrate.

3. A method of embedding a layer of material in a single crystal as claimed in claim 2 wherein the layer of material is deposited on a gallium arsenide crystal surface which is within three degrees of being perpendicular to the (100) direction.

4. A method of embedding a layer of material in a single crystal as claimed in claim 1 wherein the semiconductor substrate is of gallium arsenide and the metal layer comprises tungsten.

5. A method of embedding a layer of material in a single crystal as claimed in claim 1 wherein the layer is provided by forming a striated relief structure on a semiconductor surface and depositing the material on both sides of ridges of the relief structure by a directed deposition, the transverse dimension of the deposition on each ridge being limited by the shadow of an adjacent ridge.

6. A method of embedding a layer of material in a single crystal as claimed in claim 1 wherein the single crystal is grown over the layer of material by depositing an amorphous or polycrystalline layer over the layer and scanning that layer with an electromagnetic beam to recrystallize the layer as a single crystal from the first region.

7. A method of embedding a layer of material in a single crystal as claimed in claim 1 wherein the single crystal is grown over the layer of material by vapor phase epitaxy.

8. A method of embedding a layer of material in a single crystal as claimed in claim 1 wherein the openings are side-by-side slits.

9. A method as claimed in claim 1 for fabricating a transistor device wherein the layer of material is a metal base layer of a transistor.

10. A method of fabricating integrated circuits including the step of selectively embedding a conductive layer within single crystal semiconductor material comprising:
    providing a first layer of single crystal semiconductor material;

forming a first pattern, comprising conductive material other than said semiconductor material and from which the semiconductor material will not grow, over the semiconductor crystal layer, the pattern including wide, continuous regions to inhibit further crystal growth and including narrow regions or noncontinuous regions having openings therein to permit further crystal growth;

growing a second layer of single crystal semiconductor material from the first layer, the crystal growing over and embedding narrow or noncontinuous regions but leaving the wide continuous regions exposed; and forming a second pattern comprising conductive material over the second layer of semiconductor material, the second pattern having electrical connections with the conductive material of the first pattern at the exposed regions of the first pattern.

11. The method of fabricating integrated circuits as claimed in claim 10 wherein the first pattern including noncontinuous electrically conducting regions in electrical contact with continuous electrically conducting pads.

12. A method of fabricating integrated circuits as claimed in claim 10 wherein the first pattern includes conductive fingers extending from conductive pads.

13. A method of fabricating integrated circuits as claimed in claim 11 or 12 wherein the second pattern includes narrow or noncontinuous regions and further including the step of growing a third layer of single crystal material from the second layer, the crystal growing over and embedding the narrow or noncontinuous regions.

14. A method of fabricating integrated circuits as claimed in claim 13 further comprising the step of etching the pads of the first pattern to make those pads noncontinuous prior to growing the third layer of single crystal material.

15. A method of fabricating integrated circuits as claimed in claim 10 wherein the first pattern includes electrically conductive noncontinuous regions, at least one end of which are covered by continuous pads.

16. A method of fabricating integrated circuits as claimed in claim 10 wherein the first pattern includes conductive fingers at least one end of which are covered by pads.

17. A method of fabricating integrated circuits as claimed in claim 15 or 16 further including the step of removing pads from the first pattern prior to forming the second pattern over the second layer of single crystal material, the second pattern including electrical connections to exposed fingers in the first pattern.

18. A method of fabricating integrated circuits as claimed in claim 17 wherein the second pattern includes narrow or noncontinuous regions and further comprising the step of growing a third layer of single crystal material over the second layer, the crystal growing over and embedding the narrow or noncontinuous regions of the second pattern.

19. A method of fabricating integrated circuits as claimed in claim 10 wherein the first pattern is formed by forming a striated relief structure on a semiconductor surface and coating both sides of ridges of the relief structure by a directed metal deposition, the transverse dimension of the deposition on each ridge being limited by the shadow of an adjacent ridge.

20. A method of fabricating integrated circuits as claimed in claim 10 wherein the second layer of single crystal material is formed by depositing an amorphous or polycrystalline layer over the pattern and scanning that layer with an electromagnetic beam to recrystallize the layer as a single crystal from the first region.

21. A method of fabricating integrated circuits as claimed in claim 10 wherein the second layer of single crystal material is grown by vapor phase epitaxy.

22. A method of fabricating integrated circuits as claimed in claim 10 wherein the openings are side-by-side slits.

23. A method of selectively embedding a metallic material in a single crystal semiconductor comprising:

providing a first layer of single crystal semiconductor material;

forming a pattern comprising metallic material over the first layer of single crystal material, the pattern including wide, continuous regions to inhibit further crystal growth and including narrow regions or noncontinuous regions having openings therein to permit further crystal growth;

growing a second layer of single crystal semiconductor material from the first layer, the crystal growing over and embedding the narrow or noncontinuous regions but leaving the wide, continuous regions exposed; and forming a second pattern comprising metallic material over the second layer of semiconductor material, the second pattern having connections with the metallic material of the first pattern at the exposed regions of the first pattern.

24. A method of selectively embedding a material in a single crystal as claimed in claim 23 wherein the openings are side-by-side slits.

25. A method of isolating a semiconductor device in an integrated circuit comprising:

providing a single crystal semiconductor substrate;

forming an isolating layer of material other than that forming the semiconducting substrate onto that substrate and providing openings in the isolating layer;

growing a semiconducting material from the semiconducting substrate through the openings in the isolating layer and over that layer to embed the isolating layer; and forming the isolated semiconductor device over the openings in or on the semiconductor material in which the isolating layer is embedded.

26. A method of isolating a semiconductor device as claimed in claim 25 wherein the isolating layer is a non-semiconductor material.

27. A method of isolating a semiconductor device s claimed in claim 25 wherein the isolating layer is metal and the layer forms a Schottky barrier with the semiconductor.

28. A method of isolating a semiconductor device as claimed in claim 25 wherein the isolating layer is an insulator.

29. A method of embedding a layer of metallic material in a single crystal semiconductor comprising:

providing a single crystal gallium arsenide substrate;

providing a metal layer comprising tungsten on the single crystal gallium arsenide substrate with small, uniformly dimensioned and uniformly spaced openings in portions of that metal layer to expose portions of the substrate and without openings in other portions of the metal layer; and epitaxially growing single crystal gallium arsenide from the exposed portions of the substrate of the metal layer to embed the portions with openings while the portions without openings remain exposed.

30. A method of embedding a layer of material in a single crystal as claimed in claim 29 wherein the openings are side by side slits.

31. A method as claimed in claim 29 for fabricating a transistor device wherein the layer of material is a metal base layer of a transistor.

* * * * *

UNITED STATES PATENT AND TRADEMARK OFFICE
CERTIFICATE OF CORRECTION

PATENT NO. : 5,032,538    Page 1 of 3
DATED : July 16, 1991
INVENTOR(S) : Carl O. Bozler, Gary D. Alley, William T. Lindley and Allen Murphy It is certified that error appears in the above-identified patent and that said Letters Patent is hereby corrected as shown below: <u>IN THE DRAWINGS</u>

After Sheet 21, insert sheets 22 and 23, Figures 62-67.

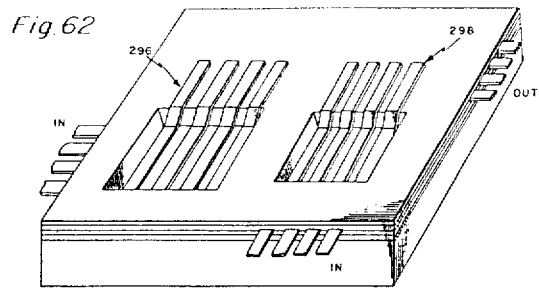

Fig. 62

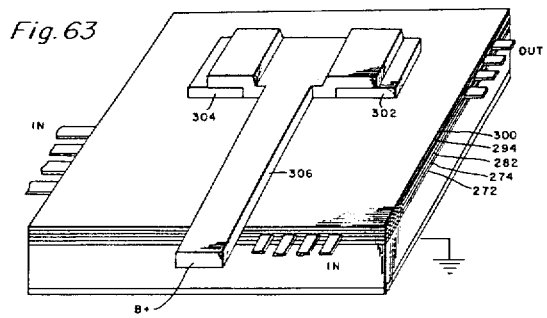

Fig. 63

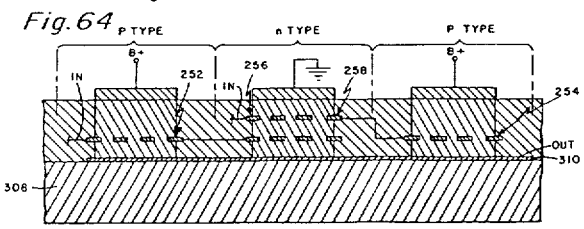

Fig. 64

UNITED STATES PATENT AND TRADEMARK OFFICE
CERTIFICATE OF CORRECTION

PATENT NO. : 5,032,538

DATED : July 16, 1991

INVENTOR(S) : Carl O. Bozler, Gary D. Alley, William T. Lindley and Allen Murphy It is certified that error appears in the above-identified patent and that said Letters Patent is hereby corrected as shown below:

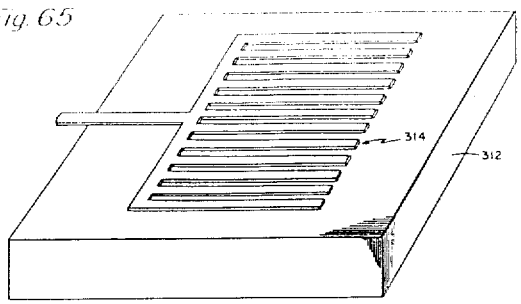

Fig. 65

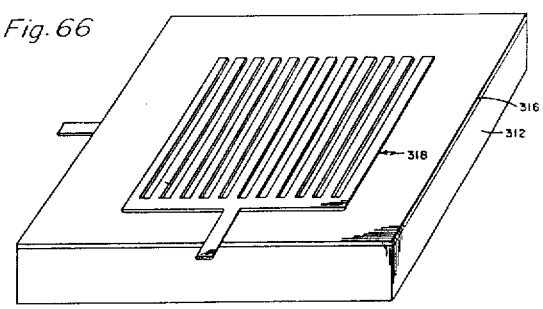

Fig. 66

UNITED STATES PATENT AND TRADEMARK OFFICE
CERTIFICATE OF CORRECTION

PATENT NO. : 5,032,538        Page 3 of 3

DATED      : July 16, 1991

INVENTOR(S) : Carl O. Bozler, Gary D. Alley, William T. Lindley and Allen Murphy It is certified that error appears in the above-identified patent and that said Letters Patent is hereby corrected as shown below:

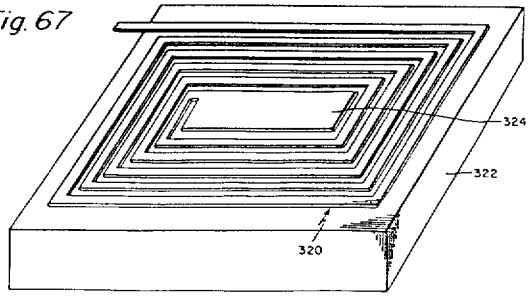

Fig. 67

Signed and Sealed this

Twenty-ninth Day of June, 1993

Attest:

MICHAEL K. KIRK

Attesting Officer    Acting Commissioner of Patents and Trademarks